(12) United States Patent
Yamamoto et al.

(10) Patent No.: US 8,445,189 B2
(45) Date of Patent: May 21, 2013

(54) DEVELOPING DEVICE AND DEVELOPING METHOD

(75) Inventors: Taro Yamamoto, Koshi (JP); Kousuke Yoshihara, Koshi (JP); Hideharu Kyouda, Koshi (JP); Hirofumi Takeguchi, Koshi (JP); Atsushi Ookouchi, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 116 days.

(21) Appl. No.: 13/024,939

(22) Filed: Feb. 10, 2011

(65) Prior Publication Data
US 2011/0127236 A1 Jun. 2, 2011

Related U.S. Application Data

(62) Division of application No. 10/584,265, filed as application No. PCT/JP2004/019415 on Dec. 24, 2004, now Pat. No. 7,918,182.

(30) Foreign Application Priority Data

Dec. 26, 2003 (JP) ................................ 2003-435894

(51) Int. Cl.
*G03C 5/18* (2006.01)
*G03C 5/26* (2006.01)
*B05B 7/06* (2006.01)
*B05B 3/00* (2006.01)

(52) U.S. Cl.
USPC ........... 430/427; 430/434; 118/667; 118/313; 118/323

(58) Field of Classification Search
USPC .................. 430/427, 434; 118/667, 313, 323
See application file for complete search history.

(56) References Cited

U.S. PATENT DOCUMENTS

| 6,284,043 B1 | 9/2001 | Takekuma |
| 6,419,408 B1 | 7/2002 | Inada |
| 6,749,688 B2 | 6/2004 | Tateyama et al. |

(Continued)

FOREIGN PATENT DOCUMENTS

| JP | 2 270318 | 11/1990 |
| JP | 3 124017 | 5/1991 |

(Continued)

OTHER PUBLICATIONS

European Search Report issued Apr. 4, 2011, in Patent Application No. 04807771.3.

*Primary Examiner* — Amanda C. Walke
(74) *Attorney, Agent, or Firm* — Oblon, Spivak, McClelland, Maier & Neustadt, L.L.P.

(57) ABSTRACT

The temperature of a developing solution is varied depending on the type of resist or the resist pattern. The developing solution is applied while scanning a developer nozzle having a slit-shaped ejection port that has a length matching the width of the effective area of the substrate. After leaving the substrate with the developing solution being coated thereon for a predetermined period of time, a diluent is supplied while scanning a diluent nozzle, thereby substantially stopping the development reaction and causing the dissolved resist components to diffuse. A desired amount of resist can be quickly dissolved through the control of the developing solution temperature, while the development can be stopped before the dissolved resist components exhibit adverse effect through the supply of the diluent a predetermined timing, whereby achieving a pattern having a uniform line width and improved throughput.

12 Claims, 18 Drawing Sheets

U.S. PATENT DOCUMENTS

| | | |
|---|---|---|
| 6,811,962 B2 | 11/2004 | Yoshihara et al. |
| 7,918,182 B2 * | 4/2011 | Yamamoto et al. ............ 118/667 |
| 8,026,048 B2 * | 9/2011 | Ookouchi et al. ............. 430/423 |
| 8,168,378 B2 * | 5/2012 | Otsuka et al. ................. 430/331 |
| 2001/0009452 A1 | 7/2001 | Matsuyama et al. |
| 2001/0047753 A1 | 12/2001 | Nagamine et al. |
| 2003/0044731 A1 | 3/2003 | Yoshihara et al. |

FOREIGN PATENT DOCUMENTS

| | | |
|---|---|---|
| JP | 2000 315643 | 11/2000 |
| JP | 2001 102292 | 4/2001 |
| JP | 2001 274082 | 10/2001 |
| JP | 2001 327909 | 11/2001 |
| JP | 2003 234286 | 8/2003 |
| JP | 2003 303752 | 10/2003 |

* cited by examiner though this diffusion starting time point somewhat varies depending on the type of resist. These dissolved resist components 13 move in a random manner, leading non-uniform dissolution of the resist. In order to avoid the influence of the non-uniform diffusion of the dissolved resist components 13, the rinse liquid may be ejected early to remove the developing solution containing the dissolved components 13 early. In this case, however, it is not possible to ensure a developing time long enough to develop a resist having a low dissolution rate. As a result, the bottom portions 14b of the resist may remain undeveloped (which is called "under-development"), for example.

DEVELOPING DEVICE AND DEVELOPING METHOD

CROSS-REFERENCE TO RELATED APPLICATIONS

This application is a divisional of U.S. application Ser. No. 10/584,265, filed Jun. 26, 2006, the entire content of which is incorporated herein by reference, which is the national stage of PCT Application No. PCT/JP2004/19415, filed Dec. 24, 2004, and claims priority under 35 U.S.C. 119 to Japanese Application No. 2003-435894, filed Dec. 26, 2003.

TECHNICAL FIELD

The present invention relates to a developing apparatus and method for developing an exposed resist on a substrate surface.

BACKGROUND ART

A semiconductor manufacturing process includes a photoresist process in which a resist is coated onto the surface of a semiconductor wafer (hereinafter referred to simply as a wafer), exposed in a predetermined pattern, and then developed to form a resist pattern. Such a process is generally performed by a system in which a coating-and-developing apparatus for coating and developing a resist is connected to an exposure apparatus.

The developing apparatus disclosed in JP2001-327909A includes a developer nozzle 11 having a slit formed in its underside and extending in the longitudinal direction thereof, as shown in FIG. 16. This slit acts as an ejection port and has a length equal to or larger than the diameter of the wafer (W). The developer nozzle 11 moves from one end to the opposite end of the wafer W, which is held still in a horizontal attitude by a spin chuck 1, while ejecting the developing solution through the ejection port facing the wafer W, thereby to deliver a developing solution to the entire surface of the wafer W.

With reference to FIG. 17, there will now be briefly described a series of steps for developing a wafer W by using the above developing apparatus. First, a wafer W with an exposed resist film on its top surface is held in a horizontal attitude on the spin chuck 1. Then, as described above, the developer nozzle 11 is moved from one end of the surface of the wafer W to the opposite end of the same to apply a developing solution D to the surface of the wafer W, as shown in FIG. 17(a). Upon reaching the opposite end, the developer nozzle 11 stops the ejection of the developing solution D and is moved to its retracted position, as shown in FIG. 17(b). Then, the wafer W with the developing solution D accumulated on its surface is left for a predetermined period of time to cause "stationary development" (of the resist), as shown in FIG. 17(c). After that, a rinse liquid nozzle 12 is positioned above the center portion of the wafer W, as shown in FIG. 17(d), and a rinse liquid R (for example, deionized water) is delivered to the center portion of the wafer W through the rinse liquid nozzle 12 while rotating the wafer W around its vertical axis by using the spin chuck 1, as shown in FIG. 17(e). Then, the supply of the rinse liquid is stopped, the rinse liquid nozzle 12 is moved to its retracted position, and the wafer W is rotated at high speed to spin-dry it, as shown in FIG. 17(f), completing the developing process. In this case, the period of time from the point of time when the developer nozzle 11 begins to eject the developing solution to the point of time the supply of the rinse liquid begins, in other words, the period during which the developing solution actually reacts with the resist due to their contact may be regarded as the actual developing time. The developing time is typically 60 seconds in the conventional art.

However, the above developing method suffers from the following problem. Generally, components 13 of the resist 14 dissolved in the developing solution D begin to diffuse from the surface layer of the resist 14 due to the concentration gradient, as schematically shown in FIG. 18, 18-20 seconds after the developing solution D is delivered, even though this diffusion starting time point somewhat varies depending on the type of resist. These dissolved resist components 13 move in a random manner, leading non-uniform dissolution of the resist. In order to avoid the influence of the non-uniform diffusion of the dissolved resist components 13, the rinse liquid may be ejected early to remove the developing solution containing the dissolved components 13 early. In this case, however, it is not possible to ensure a developing time long enough to develop a resist having a low dissolution rate. As a result, the bottom portions 14b of the resist may remain undeveloped (which is called "under-development"), for example.

DISCLOSURE OF THE INVENTION

The present invention has been made in view of the problems. It is, therefore, an object of the present invention to provide a developing apparatus and method capable of forming a pattern having a uniform line width by avoiding the influence of the dissolved resist components, even when various types of resists having different dissolution rates are developed.

To achieve the above object, the present invention provides a developing apparatus, which includes: a substrate holding unit for holding a substrate in a substantially horizontal attitude, the substrate having an exposed resist thereon; a developer supply nozzle for delivering a developing solution to the substrate, the developer supply nozzle having therein an ejection port that has a length substantially equal to or larger than a width of an effective area of the substrate; a diluent supply nozzle for delivering a diluent to the substrate, the diluent supply nozzle having therein an ejection port that has a length substantially equal to or larger than the width of the effective area of the substrate; a temperature regulating unit for controlling the temperature of the developing solution to be supplied from the developer supply nozzle according to a type of the resist on the substrate or a specific geometrical characteristic of a pattern of the resist; a drive mechanism for moving the developer supply nozzle and the diluent supply nozzle from one end of the substrate to the opposite end of the substrate; and means for controlling operation of the diluent supply nozzle such that the diluent is supplied to a surface of the substrate at a predetermined timing after the developing solution is supplied to the surface of the substrate from the developer supply nozzle. The diluent may be a low-concentration developing solution.

The present invention also provides a developing method, which includes the steps of: applying a developing solution to a surface of an exposed resist film on a substrate by using a nozzle; adjusting the temperature of the developing solution before the developing solution is applied; leaving the substrate coated with the developing solution for a predetermined period of time to promote development reaction, thereby dissolving regions of the resist to be removed by the development reaction; supplying, after the step of leaving the substrate, a diluent for diluting the developing solution to the substrate; and supplying, after the step of supplying the diluent, a cleaning liquid to the substrate for cleaning; wherein the temperature of the developing solution is adjusted such that when the substrate is left for the predetermined period of time, the regions of the resist to be removed by the development reaction is dissolved to a required extent. In this method, the application of the developing solution is preferably performed by a nozzle having therein an ejection port that has a length substantially equal to or larger than the width of the effective area of the substrate. The supply of the diluent is preferably performed through a nozzle having therein an ejection port that has a length substantially equal to or larger than the width of the effective area of the substrate.

Delivering the diluent at an appropriate timing after supplying the developing solution, the progress of the development reaction is suppressed or stopped. Further, the delivery of the diluent generates a flow in a liquid film on the substrate, causing the dissolved resist components to diffuse forcibly. As a result, it is possible to prevent variations in the line width and development defects occurring as a result of the dissolution of the resist being locally promoted or delayed due to the uneven distribution of the dissolved resist components. The diluent is preferably supplied to the developing solution on the substrate, after the bottom portion of the resist has been dissolved such that a desired line width is achieved, but before the dissolved resist components begin to exhibit adverse effect due to increase in their concentration.

In one preferred embodiment of the present invention, a plurality of developer supply nozzles are prepared; and a temperature regulating unit is assigned to each developer supply nozzle to control the temperature of the developing solution to be supplied by the developer supply nozzle. While the substrate is being processed by using a first one of the developer supply nozzles, the temperature regulating unit for a second one of the developer supply nozzles adjusts the temperature of the developing solution for this nozzle. Thus, when processing substrates with resists that are required to be developed at different temperatures, the development of a substrate with a second type of resist performed by supplying a developing solution of a second temperature from the second developer supply nozzle can be started immediately after the completion of the development of a substrate with a first type of resist performed by supplying a developing solution of a first temperature from the first developer supply nozzle. Thus, a plurality of developing solutions may be set at different temperatures beforehand, and one of them may be selected and used based on the resist to be developed. This prevents situations where the time required to heat or cool the developing solution adversely affects the throughput of the developing apparatus.

The plurality of developer supply nozzles may be integrated together into a single liquid-supplying nozzle. That is, the term "plurality" of developer supply nozzles is not limited to a plurality of developer nozzles separated from each other. Use of the integrated liquid-supplying nozzle unit reduces the footprint of the developing apparatus. Furthermore, a single drive mechanism is enough to move the nozzle, resulting in a simplified configuration of the developing apparatus.

In addition to the temperature of the developing solution, its concentration may be adjusted according to a type of the resist on the substrate and/or a specific geometrical characteristic of a pattern of the resist. The adjustment of the concentration of the developing solution may be performed by mixing the developing solution with a diluent such as deionized water. When a plurality of developer supply nozzles are employed, the developing solutions for the first and second nozzles may be different from each other not only in their temperatures but also in their concentrations.

A developer supply nozzle and a diluent supply nozzle may be integrated together into a single liquid-supplying nozzle unit. This liquid-supplying nozzle unit may be configured to eject a developing solution and a diluent through a common ejection port. The integration of the developer supply nozzle and the diluent supply nozzle reduces the footprint of the developing apparatus and simplifies the configuration of the nozzle moving mechanism. The developer supply nozzle and the diluent supply nozzle may be provided separately. In such a case, the nozzle moving speed and the nozzle moving direction when ejecting a developing solution may be the same as those when ejecting a diluent.

The liquid-supplying nozzle unit formed by integrating the developer supply nozzle and the diluent supply nozzle together may be configured to eject a developing solution and a diluent through their respective separate ejection ports. In this case, the developer ejection port and the diluent ejection port may be disposed at the front side and the back side with respect to the direction of movement of the nozzle unit when supplying a liquid. When the developer ejection port is located in front of the diluent ejection port with respect to the moving direction of the nozzle unit when supplying the liquid, a suction port may be provided between these ejection ports to suck the liquid. When developing a resist that requires only a very short developing time, the nozzle unit may be moved while simultaneously ejecting a developing solution and a diluent through the developing solution ejection nozzle and the diluent ejection nozzle behind the developing solution ejection nozzle, respectively. In this case, sucking the liquid on the substrate through the suction port can prevent development defects due to disturbed flow occurring as a result of collision between the developing solution and the diluent.

The operator may determine the temperature of the developing solution based on a type of the resist or a specific geometric characteristic of a pattern of the resist. However, it is preferable that the temperature of the developing solution be automatically determined. To this end, the control unit, which controls the entire operation of the developing apparatus based on an installed process recipe, stores, in a storage means thereof, stores association data between types of resists or specific geometrical characteristics of resist patterns and developing solution temperatures. In one typical operation mode of the developing apparatus, the control unit determines the type of resist to be developed next based on an input process schedule, and then determines a developing solution temperature suitable for developing the next resist by referring to the data stored in the storage means. The control unit then controls the temperature regulating unit to adjust the temperature of the developing solution to the determined temperature before starting the development of the substrate.

The foregoing temperature regulating unit for controlling the temperature of the developing solution may be provided in or outside the nozzle body.

The developing solution temperature is determined with placing importance on the throughput. The developing solution temperature is preferably set such that development of each portion of the effective area of the substrate has been substantially completed when the diluent is supplied to that portion even if the supply of the diluent starts before 20 seconds or less has elapsed from the apply of the developing solution.

DESCRIPTION OF PREFERRED EMBODIMENTS

Figure 1:
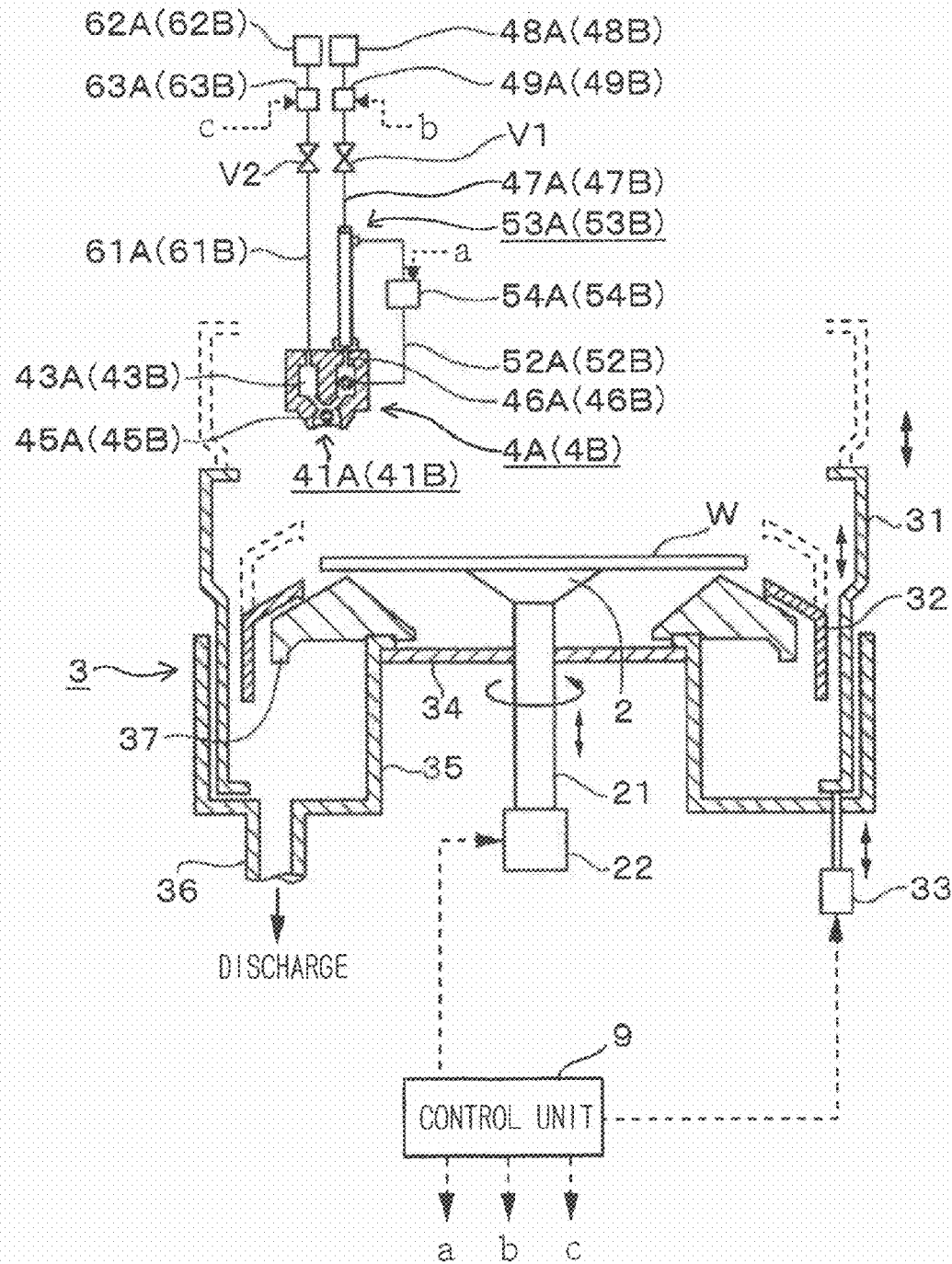
FIG. 1 is a vertical cross-sectional view of a developing apparatus in one embodiment of the present invention.

A developing apparatus in one embodiment of the present invention will be described with reference to FIGS. 1 and 2. Reference numeral 2 denotes a spin chuck (i.e., a substrate holding unit) for holding a substrate (e.g., a wafer W) in a horizontal attitude by holding the center portion of the back side of the substrate by suction. The spin chuck 2 is connected to a drive mechanism 22 through a rotational shaft 21 and can be rotated, raised and lowered together with the wafer W held thereon, by the drive mechanism 22.

A cup set 3 is provided so as to surround the wafer W held on the spin chuck 2. The cup set 3 comprises an inner cup 32 and an outer cup 31 each having an opened top end. The outer cup 31 has an upper portion thereof having a shape of a rectangular tube and a lower portion thereof having a cylindrical shape. The inner cup 32 has a shape of a cylinder having an upper portion thereof tapered inwardly. The outer cup 31 is raised and lowered by an elevating mechanism 33 connected to the lower end of the outer cup 31. The inner cup 32 is raised when a shoulder formed on the inner circumferential surface of the lower end of the outer cup 31 pushes the inner cup 32.

A circular plate 34 is provided below the spin chuck 2. A liquid receiver 35 having a shape of a substantially rectangular groove in cross section is provided outside the circular plate 34 to extend along the entire circumference of the circular plate 34. A drain port 36 is formed in the bottom of the liquid receiver 35. The developing solution and the rinse liquid that have dropped or been spun off from the wafer W are trapped within the liquid receiver 35, and are discharged from the developing apparatus through the drain port 36. A ring member 37 having a substantially triangular cross-sectional shape is provided outside the circular plate 34. Three lifting pins (not shown) penetrate through the circular plate 34. These lifting pins and a not shown substrate conveyer cooperate to allow the wafer W to be transferred to and from the spin chuck 2.

There will now be described a developer supply means for delivering a developing solution (i.e., developer) to the surface of the wafer W. The developer supply means includes a first developer nozzle 4A and a second developer nozzle 4B that are capable of vertical movement and horizontal movement. The developer nozzles 4A and 4B have the same configuration. Each component of the developer nozzle 4B corresponding to that of the developer nozzle 4A is denoted by the same reference number while the suffix "A" attached to the reference numeral of the latter is replaced with the suffix "B" attached to the reference numeral of the former. The configuration of the developer nozzle 4A will be described in detail with reference to FIGS. 3 to 5.

The developer nozzle 4A has an elongated, substantially rectangular shape, in plan view. An ejection port 41A in a form of a slit having a length substantially equal to or larger than the width of the effective area of the wafer W (in which devices are formed) is formed in the underside of the developer nozzle 4A so as to extend in the longitudinal direction of the developer nozzle 4A. A developer buffer portion (or developing solution buffer chamber) 42A for storing a developing solution and a diluent buffer portion (or diluent buffer chamber) 43A for storing a diluent such as deionized water are provided in the developer nozzle 4A such that these buffer portions are aligned in the moving direction the developer nozzle 4A (X-direction in FIG. 2; indicated the bold arrow in FIG. 3) when ejecting a liquid. The buffer portions 42A and 43A are communicated with the upper end of the ejection port 41A through a passage 44A connected to the bottom portions of the buffer portions 42A and 43A. That is, the first developer nozzle 4A is configured to eject any one of a developing solution, deionized water, or a diluted developing solution obtained by mixing the developing solution and the deionized water, by switching valves (described later). Note that the positions of the developer buffer portion 42A and the diluent buffer portion 43A may be switched with respect of the moving direction of the developer nozzle 4A).

A damper rod 45A is arranged in the ejection port 41A. A liquid to be ejected such as a developing solution or a diluted developing solution collides with the damper rod 45 before it is ejected toward the surface of the wafer W. This reduces the impact of the ejected solution on the surface of the wafer W, and ensures that the solution is ejected uniformly over the length of the ejection port 41A. Further, when a diluted developing solution is ejected, the damper rod 45A promotes mixing of the developing solution and the diluent. The passage 44A may comprise a number of holes arranged at intervals in the longitudinal direction of the developer nozzle 4A, or may comprise an elongated slit (or a single hole) extending in the longitudinal direction of the developer nozzle 4A. In the illustrated embodiment, the passage 44 comprises a number of holes.

Figure 4:
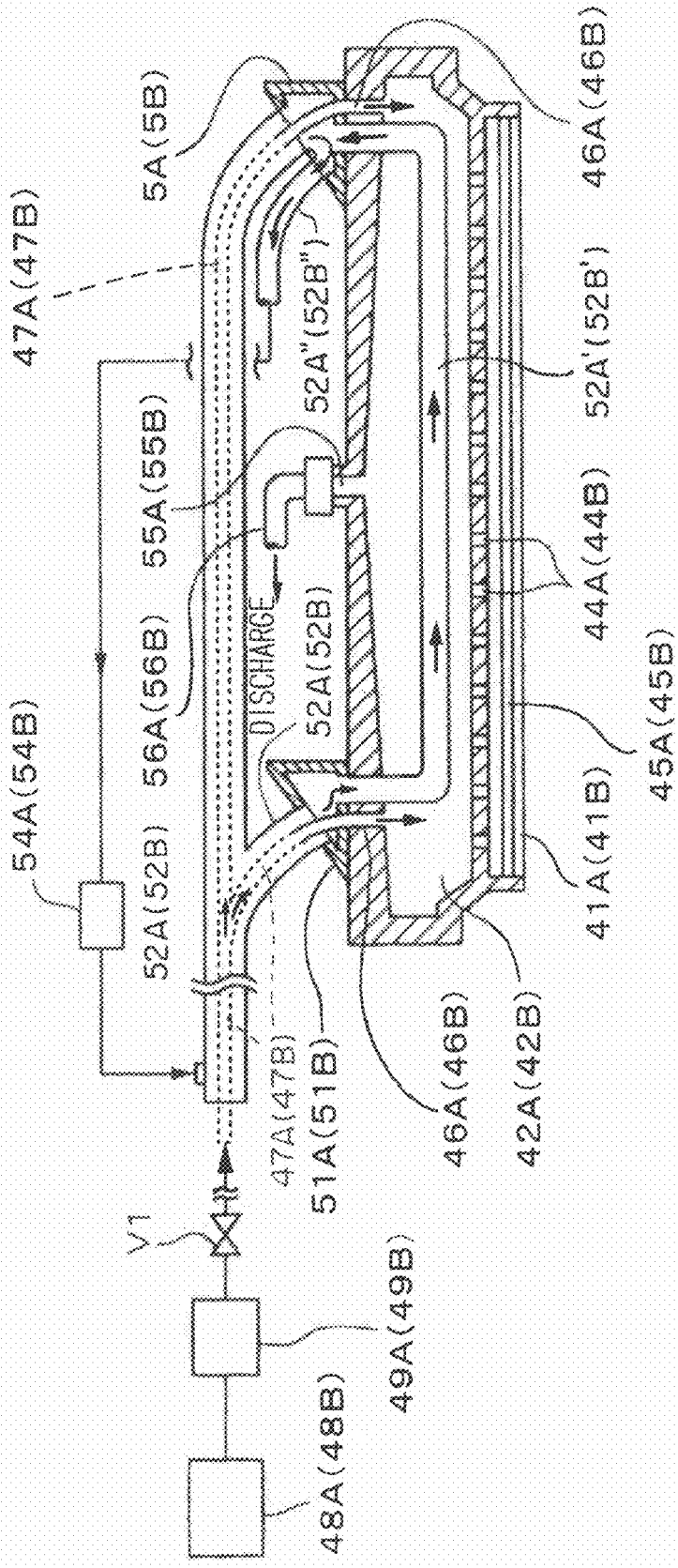
FIG. 4 is a vertical cross-sectional view of the developer nozzle of the developing apparatus taken along the length direction of the nozzle.

Two developer supply ports 46A are provided in the top portion of the developer buffer portion 42A. Specifically, as shown in FIG. 4, the developer supply ports 46A are respectively arranged in opposite end portions of the developer buffer portion 42A with respect to the longitudinal direction of the developer nozzle 4A. A developer tube (i.e., developer supply passage) 47A connected to a developer supply source 48A branches into two branch tubes each connected to a respective developer supply port 46A. Provided in the developer tube 47A are: a main temperature regulating unit 49A for adjusting the temperature of the developing solution to a predetermined value; a valve V1; and a liquid feeding means (not shown). The liquid feeding means comprises a bellows pump whose discharge flow rate can be controlled by changing the discharge stroke.

Temperature-control water buffer portions (i.e., temperature-control water buffer chambers) 5A and 51A are provided above the developer supply ports 46A. The developer tube 47A runs inside of a temperature-control water tube (i.e., temperature-control water passage) 52A from a predetermined position (in the illustrated embodiment, a position upstream of the branch point of the developer tube 47A) to the temperature-control water buffer portions 5A and 51A, thus forming a double tube structure 53A composed of the developer tube 47A and the temperature-control water tube 52A. A temperature-control water tube 52A' is provided in the developer buffer portion 42A to connect the temperature-control water buffer portions 5A and 51A with each other. Heat is exchanged between the developing solution and the temperature-control water through the walls of the temperature control water tubes 52A and 52A', so that the temperature of the developing solution is controlled. That is, the double tube structure 53A, the temperature control water tube 52A', and the developer buffer portion 42A constitute an auxiliary temperature regulating unit for adjusting the temperature of the developing solution. One end of a temperature-control water tube 52A" is connected to the temperature-control water buffer portion 5A, while the other end thereof is connected to an end portion of the temperature-control water tube 52A. The temperature control water tubes 52A, 52A', and 52A" form a circulation passage. A temperature controller 54A (e.g., a heat exchanger) is provided in this circulation passage to adjust the temperature of the temperature-control water to a predetermined value. This arrangement allows the main temperature regulating unit 49A and the auxiliary temperature regulating unit to control the temperature of the developing solution within the range of, for example, 5° C. to 60° C. Note that the arrows in FIG. 4 indicate the flow of the developing solution and the temperature-control water.

As shown in FIG. 4, the center portion of the inside wall surface of the ceiling of the developer buffer portion 42A is higher than the other portions and has an exhaust port 55A formed therein. One end of an exhaust passage 56A is connected to the exhaust port 55A, while the other end is connected to a suction means (not shown). Gases, such as nitrogen that was dissolved in the developing solution, are discharged through the exhaust port 55A.

Figure 3:
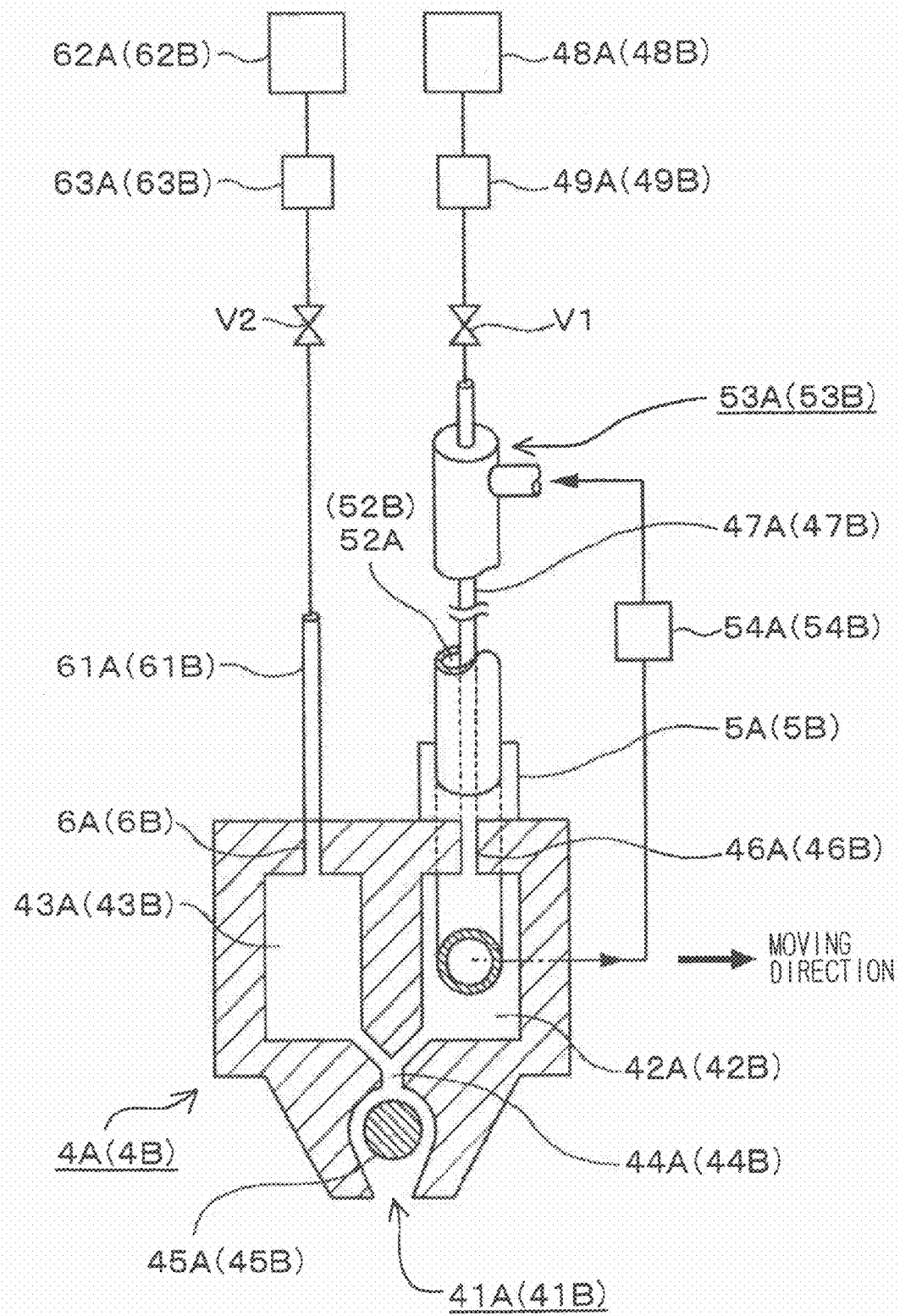
FIG. 3 is a vertical cross-sectional view of a developer nozzle of the developing apparatus taken along the width direction of the nozzle.
Figure 5:
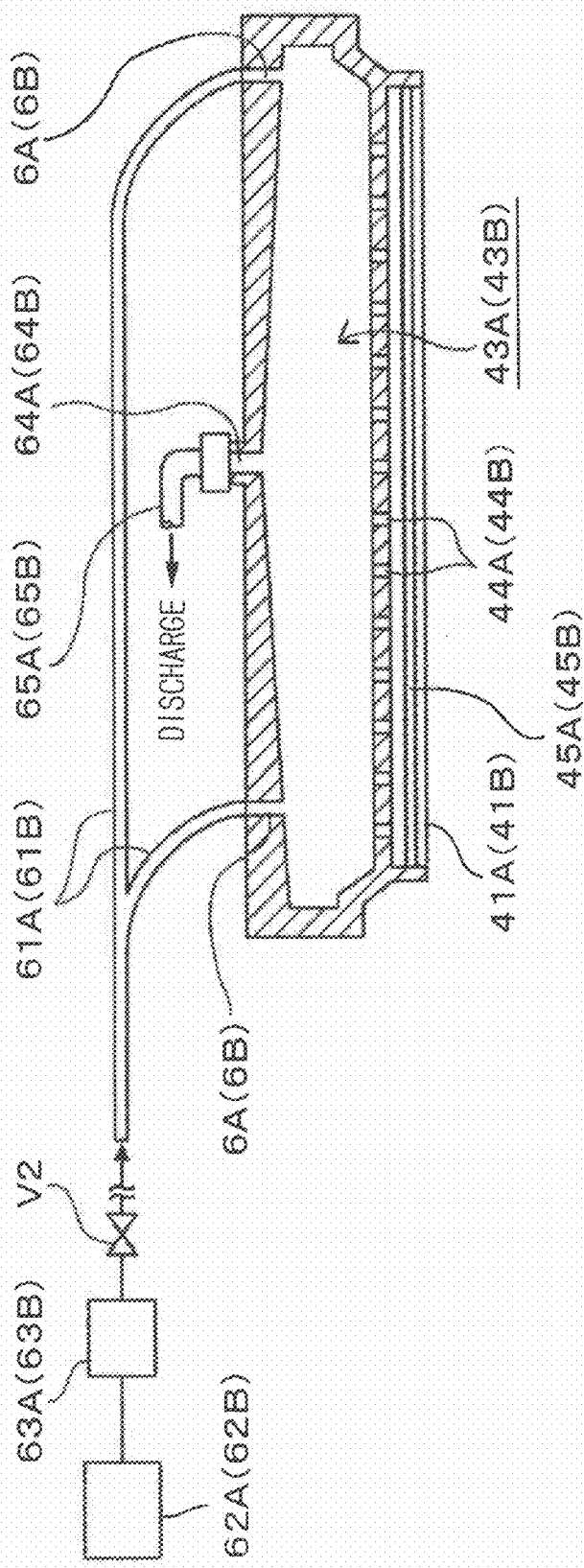
FIG. 5 is another vertical cross-sectional view of the developer nozzle of the developing apparatus taken along the length direction of the nozzle.

As shown in FIGS. 3 and 5, two diluent supply ports 6A are provided in the top portion of the diluent buffer portion 43A. Specifically, the diluent supply ports 6A are respectively provided in opposite end portions of the diluent buffer portion 43A with respect to the longitudinal direction of the developer nozzle 4A. A diluent tube (i.e., diluent supply passage) 61A connected to a diluent supply source 62A branches into two branch tubes each connected to a respective diluent supply port 6A. Provide d in the diluent tube 61A are: a diluent temperature regulating unit 63A for controlling the temperature of the diluent (e.g., deionized water); a valve V2; and a liquid feeding means (not shown) which may be a bellows pump whose discharge flow rate can be controlled by changing the discharge stroke. The center portion of the inside wall surface of the ceiling of the diluent buffer portion 43A is higher than the other portions and has an exhaust port 64A formed therein. One end of an exhaust passage 65A is connected to the exhaust port 64A, while the other end is connected to a suction means (not shown).

Referring back to FIG. 2, the developer nozzles 4A (4B) are supported on one end of a nozzle arm (i.e., nozzle support member) 7A (7B). The other end of the nozzle arm 7A (7B) is connected to moving bases 71A (71B) including an elevating mechanism (not shown). The moving base 71A (71B) can be moved along the guide members 72A (72B), that extend on the bottom wall of the enclosure of this developing apparatus (or developing unit) in the X-direction. In FIG. 2, reference numeral 73 denotes a waiting area for the developer nozzle 4A (4B). The tip portion of each nozzle may be cleaned in the nozzle waiting area 73.

The developing apparatus further includes a rinse liquid nozzle 8 capable of vertical movement and horizontal movement. The rinse liquid nozzle 8 has a fine ejection port 80 for ejecting a rinse liquid such as deionized water against the wafer W when it faces the surface of the wafer W. A rinse liquid supply source (not shown) is connected to the rinse liquid nozzle 8 through a rinse liquid tube (not shown), connected to which is a liquid feeding means (not shown), for example, a bellows pump whose discharge flow rate can be controlled by changing the discharge stroke. The rinse liquid nozzle 8 is connected through a nozzle arm 83 to a moving base 84 including an elevating mechanism (not shown). The moving base 84 is moved along the guide member 72A shared by the moving base 71A for the first developer nozzle 4A such that the first developer nozzle 4A and the rinse liquid nozzle 8 do not interfere with each other. In FIG. 2, reference numeral 85 denotes a waiting area for the rinse liquid nozzle 8.

Figure 2:
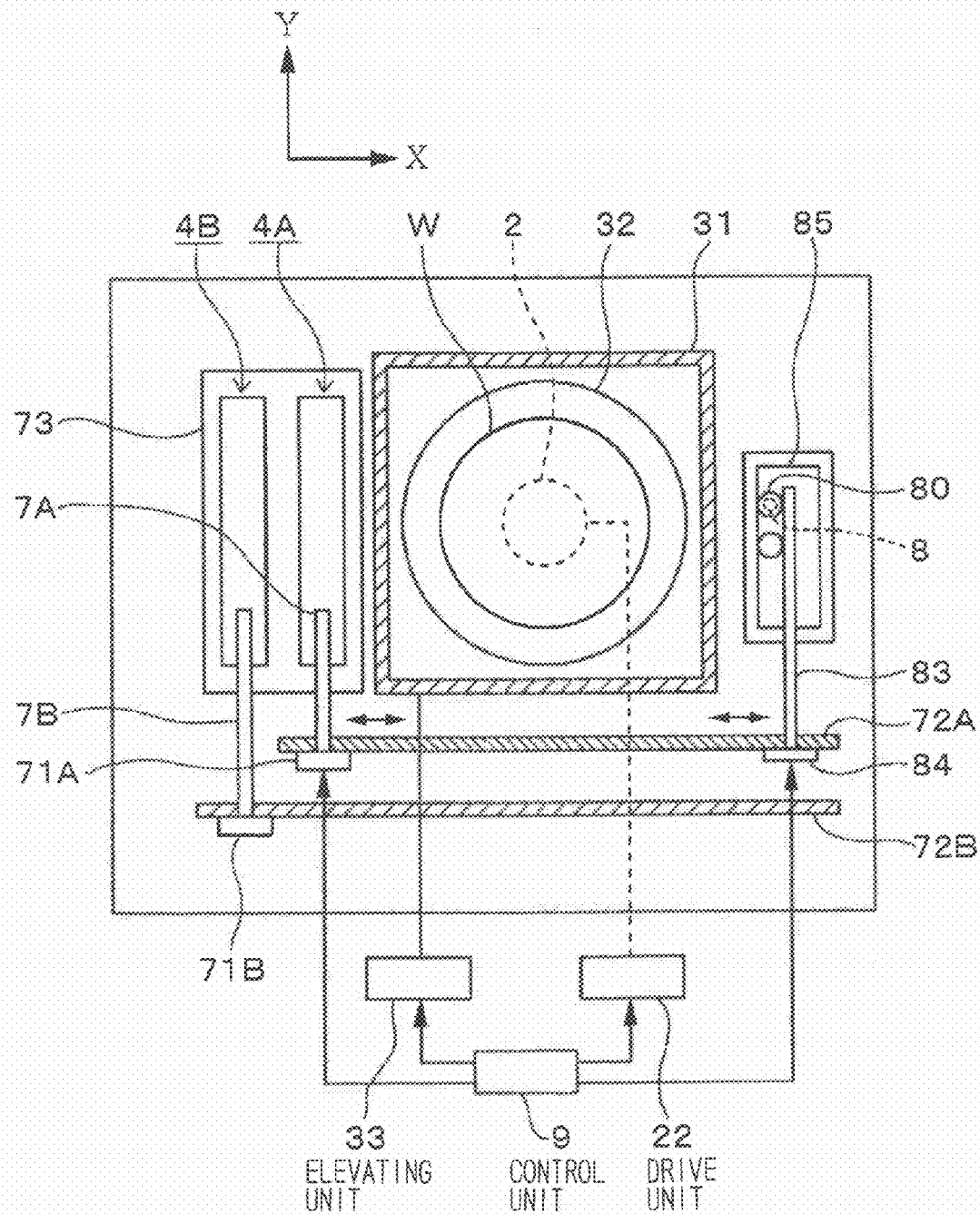
FIG. 2 is a plan view of the developing apparatus in the embodiment of the present invention.

Referring to FIG. 2, reference numeral 9 denotes a control unit for controlling the entire operation of the developing apparatus. Specifically, the control unit 9 has functions of: controlling the operations of the drive mechanism 22, an elevating unit 33, and the moving substrates 71A, 71B, and 84; controlling the temperature control operations of the main temperature regulating unit 49A (49B) and the auxiliary temperature regulating unit so as to adjust the temperature of the developing solution delivered to the surface of the wafer W to the predetermined value; and adjusting the temperature of the diluent to a predetermined value (for example, adjust it to the same temperature as the developing solution) by using the diluent temperature regulating unit 63A. A storage unit (e.g., a memory) provided in the control unit 9 stores, for example, data expressing the relationship between various types of resists and a developing solution temperature at which each type of resist should be developed (The developing solution temperature is in the range of 5° C. to 60° C.). The control unit 9 refers to the data to determine the developing solution temperature for the type of resist to be developed. In other words, the control unit 9 determines the temperature of the developing solution based on the dissolution characteristics of each type of resist in the developing solution and controls the operation of each temperature regulating unit accordingly. The control unit 9 may be adapted such that the operator enters the developing solution temperature by using an input means of the control unit 9, instead of automatically determining it based on data stored in the memory as described above.

The following are exemplary developing solution temperatures. When the resist to be developed is for a KrF light source and has a low dissolution rate in the developing solution, the developing solution temperature may be set in the range of 40° C. to 60° C. When the resist is for an ArF light source (studied for application in recent years) and has a high dissolution rate in the developing solution, the developing solution temperature may be set in the range of 20° C. to 40° C. In the case of a resist for an i-ray source or a g-ray source, which readily dissolves at low temperatures, the developing solution temperature may be set in the range of 10° C. to 20° C. The developing solution temperature for each resist is determined based on the temperature at under which dissolution of the resist is promoted, not on the type of the light source used to expose the resist.

Then, process steps for developing the wafer W by using the developing apparatus will be described. The developing apparatus is initially set such that: the outer cup 31 and the inner cup 32 are at their lowered positions; and the developer nozzles 4A and 4B and the rinse nozzle 6 are positioned above the nozzle waiting portion 73, respectively. First, a wafer W having an exposed resist thereon is transferred to the developing apparatus by a substrate conveyer, not shown. The substrate conveyer and the lifting pins (not shown) cooperate to transfer the wafer W to the spin chuck 2. Before the wafer W is transferred to the spin chuck 2, the control unit 9 determines the developing solution temperature based on the type of resist coated on the wafer W and based on the data stored in the memory described above. Furthermore, the control unit 9 selects a nozzle for developing the wafer W from the two developer nozzles 4A and 4B (in this example, selects the first developer nozzle 4A), and causes the main temperature regulating unit 49A and the auxiliary temperature regulating unit to adjust the temperature of the developing solution to be ejected through the selected first developer nozzle 4A such that it coincides with the determined developing solution temperature. As a result, the temperature-controlled developing solution stored in the developer buffer portion 42A and the developer tube 47A upstream of the developer buffer portion 42A is ready to be ejected through the developer nozzle 4A. Further, the control unit 9 causes the diluent temperature regulating unit 63A to adjust the temperature of the diluent such that it coincides with a predetermined temperature (for example, the temperature of the developing solution).

Then, the first developer nozzle 4A is moved to a developer-ejection start position, which is slightly outside the outer edge of the wafer W and slightly higher than the surface of the wafer W. Note that, at present, the second developer nozzle 4B is staying in the nozzle waiting area 73. However, when wafers W are being processed by using the first developer nozzle 4A, preparation of the processing of wafers W of the next production lot by using the second developer nozzle 4B is performed concurrently.

Figure 6:
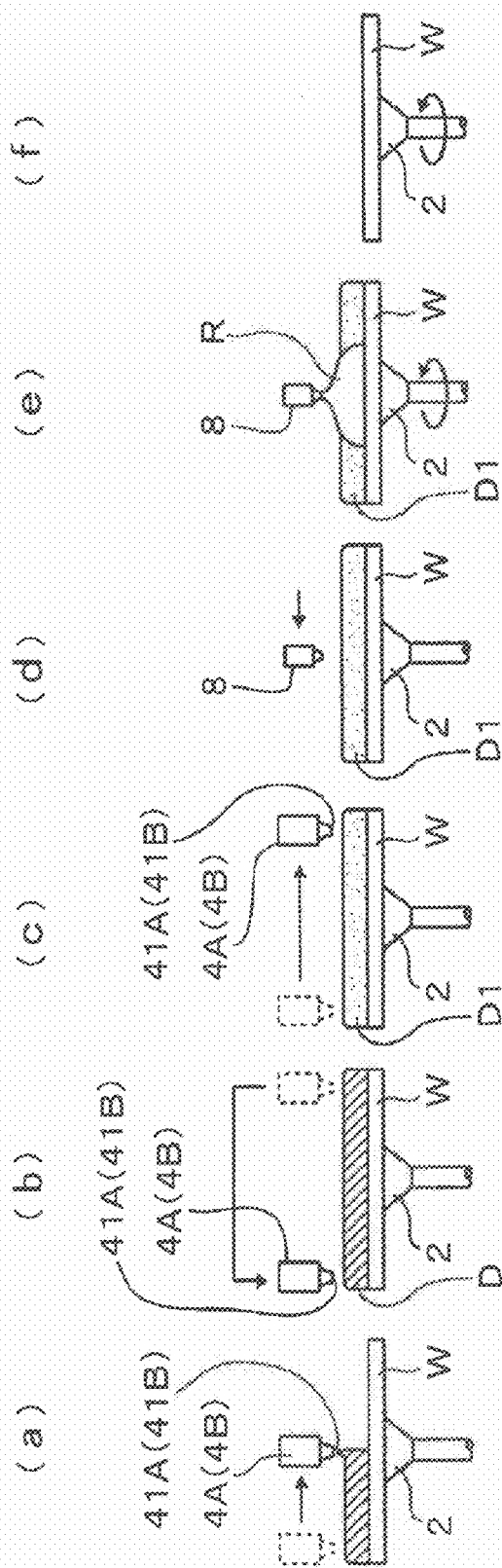
FIG. 6 shows diagrams illustrating developer supply means of the developing apparatus.
Figure 16:
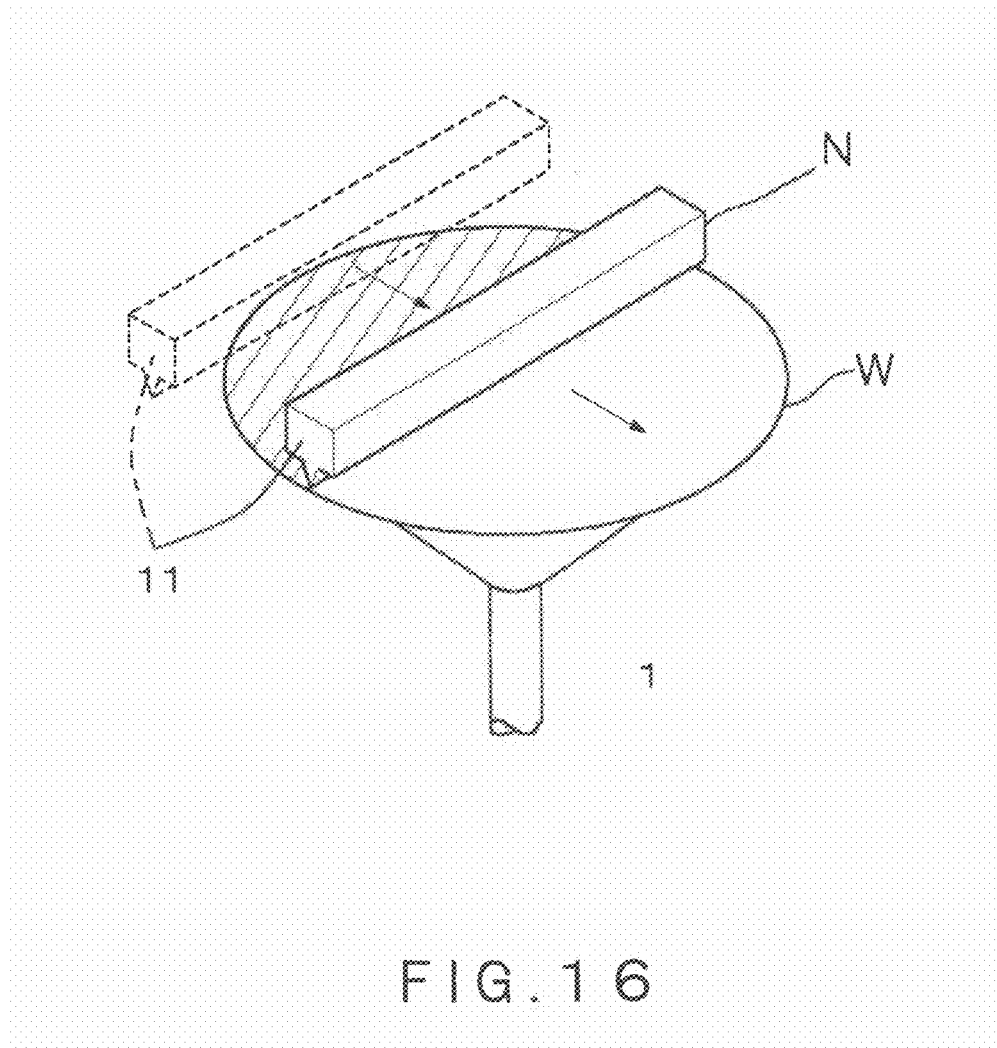
FIG. 16 is a diagram illustrating a conventional developing apparatus.
Figure 17:
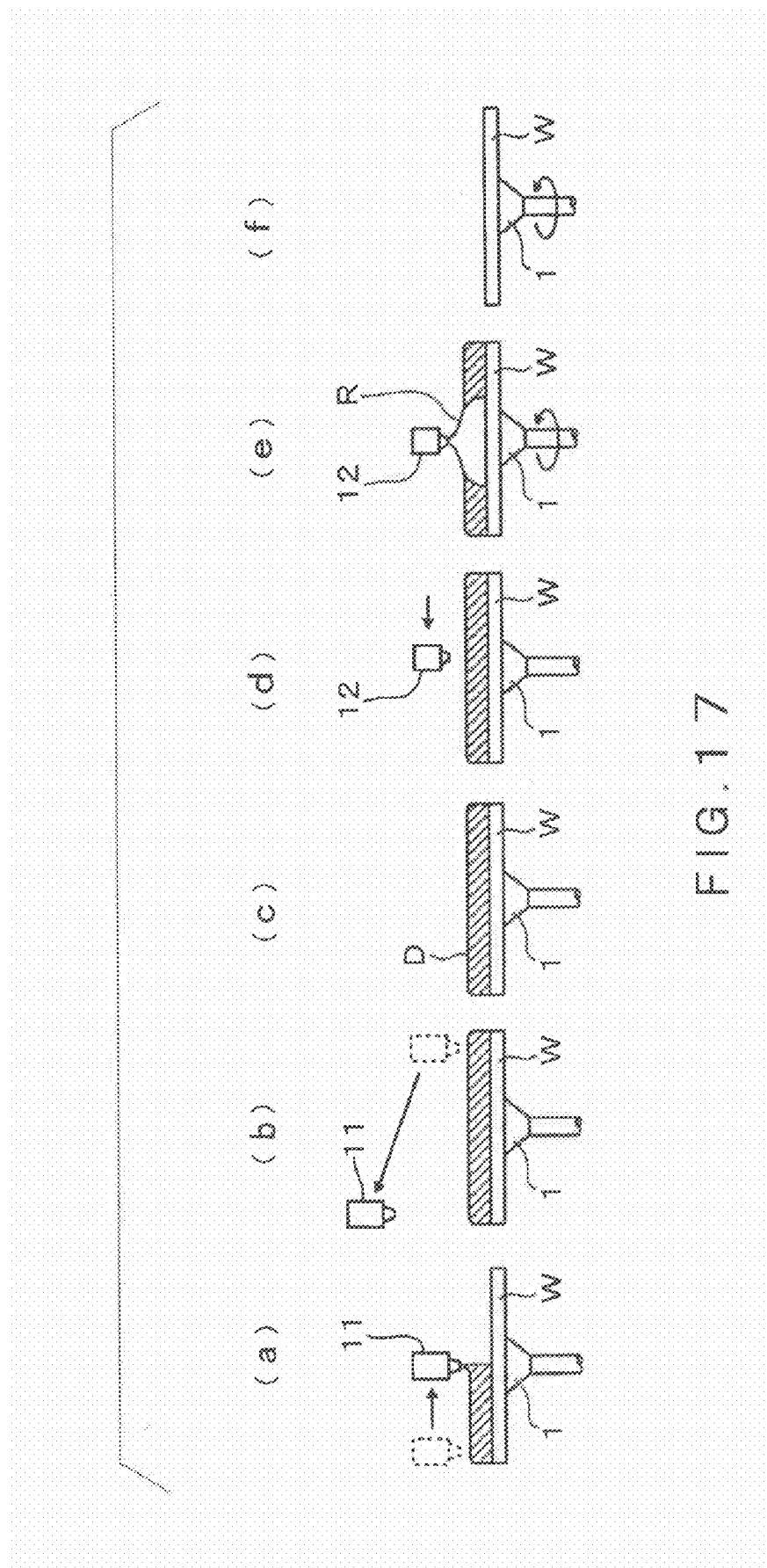
FIG. 17 is a diagram showing a process of developing a wafer by using the conventional developing apparatus.
Figure 18:
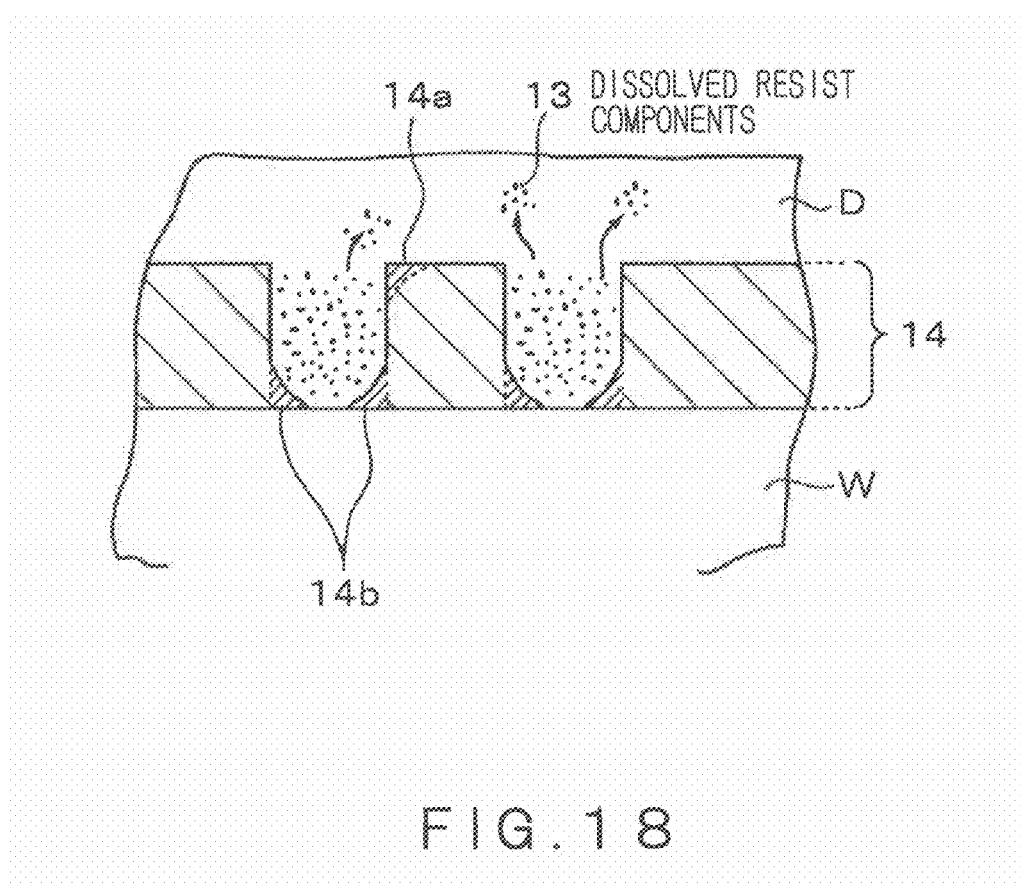
FIG. 18 is a diagram illustrating a conventional developing apparatus.

Then, the first developer nozzle 4A makes a translational motion across the surface of the wafer W, which is held still, from one end to the diametrically opposite end of the wafer W (This movement of the nozzle 4A is the same as that of the nozzle N in FIG. 16 described in connection with a conventional art.), while the valve V1 is being opened to eject the developing solution D from the ejection port 41A, as shown in FIG. 6(a). In the case of a 12-inch wafer W, for example, the moving speed of the nozzle is set such that it takes 5 seconds for the nozzle to move from one end to the opposite end of the wafer W. Thereby, a film of the developing solution D is formed on the entire surface of the wafer W. The soluble portions of the resist is dissolved in the developing solution, while the insoluble portions of the resist is not dissolved and thus remain, whereby a predetermined resist pattern is formed.

After the first developer nozzle 4A has passed the above opposite end of the wafer W, the valve V1 is closed to stop the ejection of the developing solution D from the first developer nozzle 4A. Then, the first developer nozzle 4A is raised, moved to the one end side of the wafer W, and then lowered to the ejection start position again, as shown in FIG. 6(b). The mechanism for moving the developer nozzle is adapted such that it takes 5 seconds or less for the first developer nozzle 4A to return to the ejection start position after stopping the ejection of the developing solution.

Then, the valves V1 and V2 are opened to deliver the developing solution and the diluent into the passage 44 through the developer buffer portion 42A and the diluent buffer portion 43A at predetermined flow rates. As a result, a diluted developing solution of the delivered developing solution and diluent is ejected from the ejection port 41A. The concentration of the developing solution in the diluted developing solution is preferably such that the diluted developing solution is incapable of dissolving the resist. Then, as shown in FIG. 6(c), the first developer nozzle 4A is moved from the one end to the opposite end of the wafer W while ejecting the diluted developing solution D1 from the ejection port 41A in the same manner as that in the case where the developing solution is ejected. The moving speed of the nozzle is the same as when the developing solution D is supplied. The diluted developing solution is supplied 10 seconds after the supply of the developing solution (i.e., non-diluted developing solution), that is, before non-uniform diffusion of the dissolved resist components occurs. Scanning application of the diluted developing solution not only moves the dissolved resist components in the surface area of the developing solution on the surface of the wafer W, but also removes the dissolved resist components from recesses formed in the resist due to dissolution of the resist. As a result, these dissolved resist components diffuse in the developing solution on the surface of the wafer W. Since the concentration of the developing solution on the surface of the wafer W is reduced due to the application of the diluted developing solution, the dissolution of the resist is suppressed or stopped, and thus substantially no further dissolution of the resist occurs. Therefore, the adverse effects of the diffusion of the dissolved resist components are very small.

Then, the valves V1 and V2 are closed to stop the ejection of the diluted developing solution D1. After that, the developer nozzle 4A is moved to its retracted position and the rinse liquid nozzle 8 (or cleaning liquid nozzle) is positioned above the center portion of the wafer W, as shown in FIG. 6(d). A rinse liquid R is supplied from the rinse liquid nozzle 8 to the surface of the wafer W while the wafer W is rotated around its vertical axis by the spin chuck 2. The rinse liquid R spreads outward due to centrifugal force, removing the developing solution containing dissolved resist components and thereby cleaning the surface of the wafer W.

Then, the supply of the rinse liquid R is stopped and the rinse liquid nozzle 8 is moved to its retracted position. After that, the wafer W is rotated at a high speed (e.g., 2000 rpm) to perform spin-drying to spin off the liquid on the wafer surface, as shown in FIG. 6(e). Then, the outer cup 31 and the inner cup 32 are lowered and the wafer W is transferred from the developing apparatus by the not shown substrate conveyer. In this way, a series of steps for developing one wafer W are completed.

In a case where wafers W of a certain production lot (hereinafter referred to as "first production lot") are processed by using the developer nozzle 4A and wafers W of a next production lot (hereinafter referred to as "second production lot") are subsequently processed after completion of the processing of the first production lot, the developing solution temperature for the wafers W of the second production lot is determined based on the type of resist on these wafers W, and the main temperature regulating unit and the auxiliary temperature regulating unit assigned to the developer nozzle 4B, which is standing-by, control the temperature of the developing solution for the developer nozzle 4B before starting the process of the first wafer W of the second production lot. After completion of the development of the wafers W of the first production lot, the wafers W of the second production lot are developed by using the developer nozzle 4B according to the same procedure as described above. Note that, processing schedule data indicating the number and the type of wafers W (or the type of resist on the wafers W) to be processed is inputted beforehand into the memory of the control unit 9 through the input means. Based on this data, the control unit 9 determines the temperature of the developing solution to be prepared.

According to the foregoing embodiment, as the scanning application of the diluted developing solution by using the developer nozzle 4A (4B) is performed after a predetermined time has elapsed from the supply of the developing solution, the developing solution is quasi-statically diluted, thereby suppressing or stopping the progress of the development reaction and forcing the dissolved resist components to diffuse. As a result, it is possible to prevent variations in the line width and development defects due to spatial variations in the resist dissolution rate caused by spatial variations in the concentration of the dissolved resist components. The diluted developing solution must be supplied before the dissolved resist components exhibit adverse effect due to an increase in their concentration (20 seconds or less, preferably 10 seconds, after the supply of the developing solution). On the other hand, the diluted developing solution must be supplied after the dissolution of the resist has progressed to the bottom of the resist to achieve the desired line width. In a case where the resist has a low dissolution rate, if the diluted developing solution is supplied early, the desired line width cannot be achieved. In this embodiment, the developing solution temperature is determined such that the resist is dissolved to such an extent that the desired line width can be achieved before the supply of the diluted developing solution. Thus, a pattern having a desired line width can be achieved while avoiding the adverse effects of the dissolved resist components. As a result, the developing process can provide high in-plane uniformity of the line width.

Figure 7:
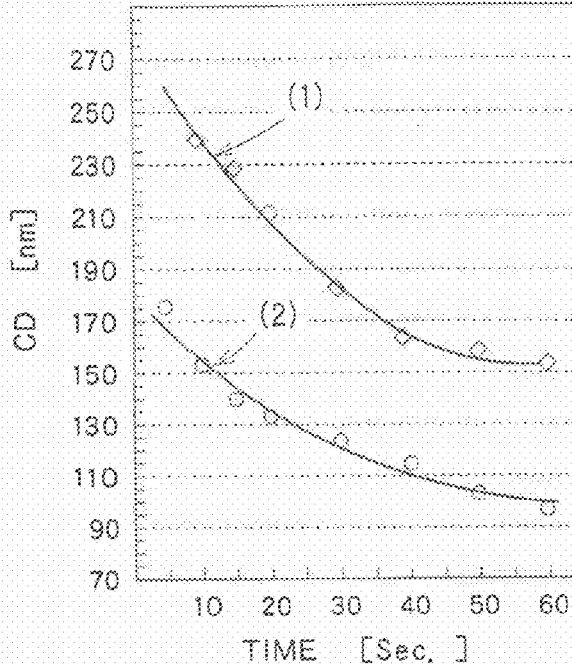
FIG. 7 shows graphs showing relationships between a line width of a pattern and a developing time or a developing solution temperature.
Figure 7:
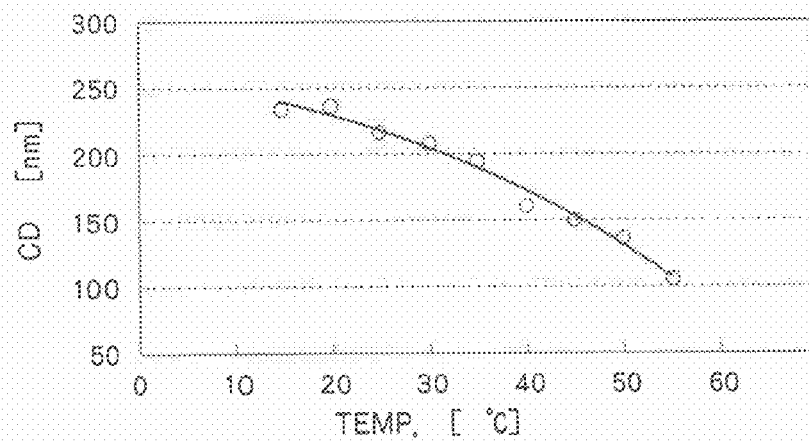
Figure 7:
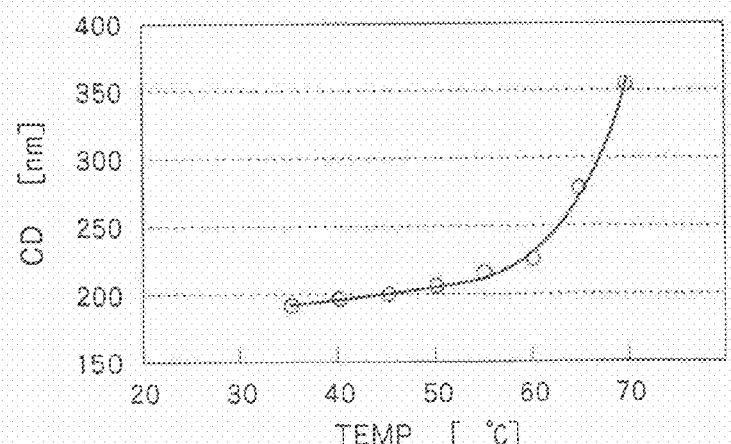

FIG. 7(a) shows the relationship between the developing time and the line width (CD) of the pattern for two developing solution temperatures, in a certain developing solution. Curve (1) shows the relationship at 23° C. (clean room temperature), and curve (2) shows the relationship at 50° C. The developing solution has a property that its resist dissolution rate increases with increasing in temperature. More specifically, if the desired line width is 150 nm, the time required to achieve the desired line width is 50-60 seconds at 23° C., and approximately 10 seconds at 50° C. In this case, the developing solution temperature is set at 50° C. Note that when using a developing solution having a property that its resist dissolution rate increases with decreasing in temperature, the developing solution temperature may be determined in a similar manner to that described above.

In order to produce consistent, favorable development results, it is considered that following conditions must be satisfied: (A) the development reaction is stopped at a point of time when the resist-dissolving rate of the developing solution has been saturated, in other words, at a point of time when the quality of the developing solution has degraded as a result of progress in the development reaction and hence the development reaction rate has become low; and (b) the development reaction is stopped when the concentration distribution of the dissolved resist components remains still relatively uniform. Both conditions (a) and (b) can be best satisfied if the diluent is supplied at a point of time when the resist-dissolving rate of the developing solution has been just saturated. As described above, in a conventional static developing process, the developing time is usually set to 60 seconds. However, the inventors of the present invention have found that a developing time of 20 seconds is long enough for many type of developing solutions at a developing solution temperature of 23° C. According to the present invention, based on the above knowledge, the timing of the supply of the diluent is set 20 seconds or less after the supply of the developing solution.

The developing time required to form an appropriate pattern varies depending on not only the type of resist but also geometrical factors specifying the pattern. Therefore, the developing solution temperature may be changed according to the geometrical factors. The geometrical factors of a pattern include its desired line width, pattern density, and pattern shape. The pattern shape may be specified, for example, based on the shape of the portion of the resist dissolved due to the developing process (for example, a straight groove, a cylindrical hole, etc.), and on the area ratio of the grooves and holes in the pattern. Specifically, the developing solution temperature may be lowered for dense patterns and raised for rough patterns. Note that the developing solution temperature may be changed according to both the type of resist and the geometrical factors of the pattern.

FIGS. 7(b) and 7(c) are graphs illustrating experimental results, wherein: FIG. 7(b) shows the relationship between the developing solution temperature and the line width (CD) when forming grooves; and FIG. 7(c) shows the relationship between the developing solution temperature and the line width (CD) when forming holes. The developing time was 10 seconds in both cases. These graphs indicate that the pattern line width has greater temperature dependence when forming grooves than when forming holes. Therefore, when grooves and holes are formed at once, the developing solution temperature may be determined with placing priority on the developing conditions of the grooves.

According to the foregoing embodiment, the developing apparatus includes two separate developer nozzles 4A and 4B adapted to control the temperatures of the developing solution to be supplied therefrom at different values independently. Therefore, when wafers W of a certain production lot are being processed by using one of the nozzles 4A and 4B, the temperature of the developing solution for the other nozzle can be adjusted to prepare for the processing of wafers W of the next production lot. Thus, the first wafer W of the next production lot can be processed immediately after completion of the development of the last wafer W of the current production lot, which eliminates loss of time incurred due to change in developing solution temperature, resulting in improved throughput.

Another embodiment of the developer nozzle 4A will be described with reference to FIG. 8. This developer nozzle 4A has a plurality of (e.g., two) developer buffer portions 42A therein. The diluent buffer portion 43 is sandwiched between these developer buffer portions 42A. The temperature of the developing solution delivered from each developer buffer portion 42A to the ejection port 41A is adjusted by a main temperature regulating unit and an auxiliary temperature regulating unit arranged exclusively for each respective developer buffer portion 42A. A developing solution can be supplied from each developer buffer portion 42A to the surface of the wafer W through the ejection port 41A by opening the corresponding valve V1. The developer nozzle 4A shown in FIG. 8 is the same as the developer nozzle 4A shown in FIG. 3, except for the above respects.

Figure 8:
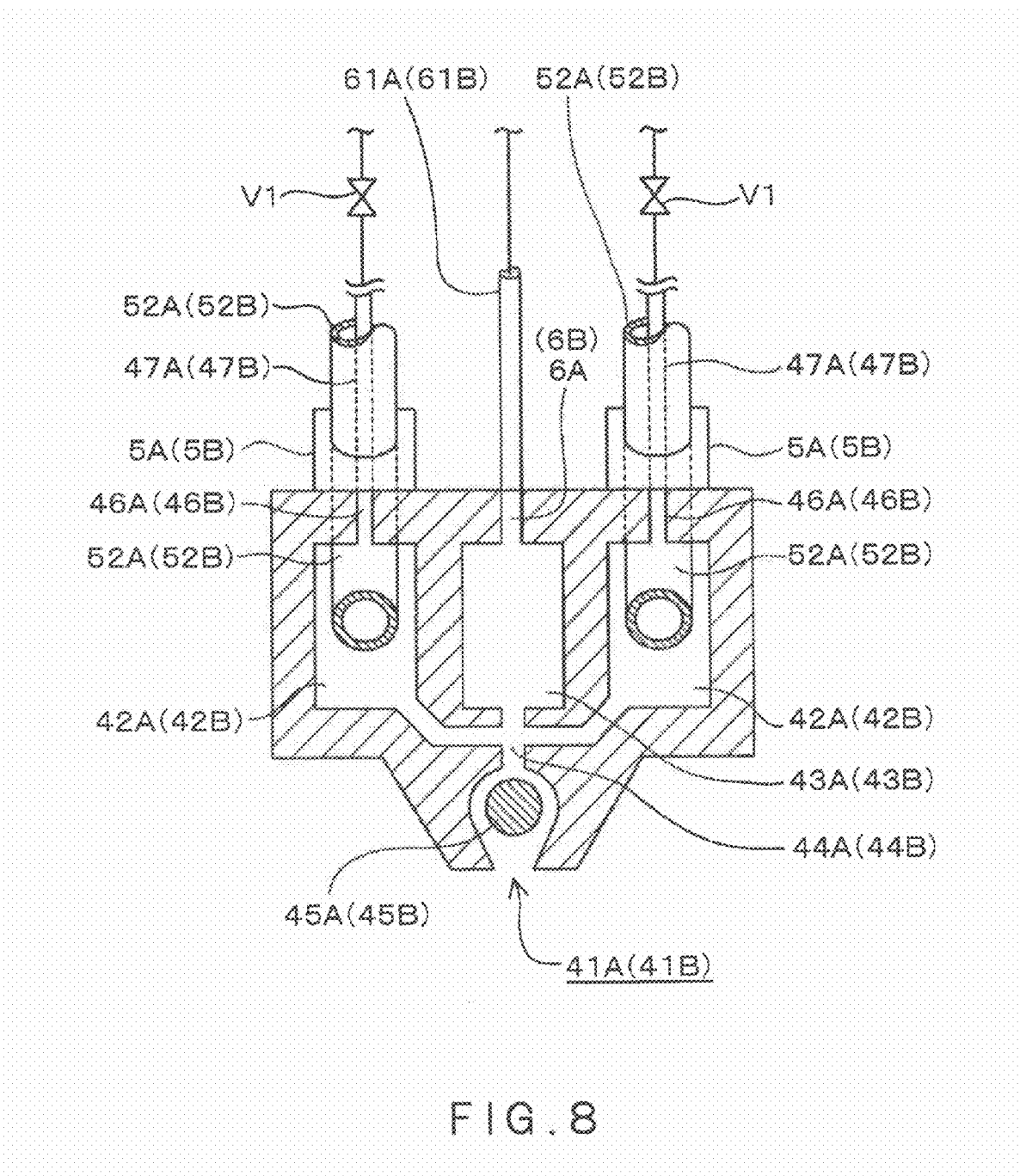
FIG. 8 is a diagram showing a process of developing a wafer by using the developing apparatus.

The following operation can be performed by using the developer nozzle 4A shown in FIG. 8. While wafers W of a certain production lot are being processed by using the developing solution delivered from one of the two developer buffer portions 42A, the temperature of the developing solution to be delivered from the other developer buffer portion 42A for the next production lot is adjusted based on the type of resist on the wafers W of the next production lot before starting of the processing of the first wafer W of the next production lot. When the wafers W of the next production lot are processed, the valves V1 are switched to deliver a developing solution to the surface of the wafer W through the other developer buffer portion 42A and the ejection port 41A.

The developer nozzle 4A shown in FIG. 8 may be regarded as a single nozzle unit constituted by integrating a plurality of developer nozzles. Advantageously, the single developer nozzle can be used to process different types of resists sequentially, eliminating the need for employing a plurality of developer nozzles and hence reducing the installation space for the developing apparatus. As the diluent buffer portion 43A is interposed between the developer buffer portions 42A, fluctuation in the temperature of each developing solution due to heat transfer between the developer buffer portions 42A can be suppressed even if the temperatures of the developing solutions in the developer buffer portions 42A are different from each other.

The developer nozzle 4A shown in FIG. 8 may also be used in the following manner. Developing solutions set at different temperatures (for example, 60° C. and 5° C.) are supplied to the developer buffer portions 42A. Then, the flow rate ratio between the developing solutions delivered from these developer buffer portions 42A to the ejection port 41A may be changed to adjust the temperature of the developing solution ejected from the ejection port 41A. The flow rate ratio may be changed under the control of the control unit 9. This arrangement can flexibly respond to switching many types of resists, eliminating the operation of adjusting the temperature of the developing solution stored in a developer buffer portion 42A in response to different types of resists which otherwise is needed.

Still another embodiment of the developer nozzle will be described with reference to FIG. 9. The developer nozzle 4A shown in FIG. 9 includes a developer ejection port 41A and a diluent ejection port 100A, separately, which are provided for exclusively ejecting a developing solution and a diluent, respectively. The diluent ejection port 100A is disposed behind the developer ejection port 41A with respect to the traveling direction of the developer nozzle 4A when the nozzle 4A ejects liquids. The developer nozzle 4A shown in FIG. 9 has substantially the same structure as that of the developer nozzle 4A shown in FIG. 3, except for the above respects. The developer nozzle 4A shown in FIG. 9 can move from one end to the opposite end of the wafer W while simultaneously ejecting a developing solution and a diluent through the developer ejection port 41A and the diluent ejection port 100A, respectively. Therefore, this nozzle is useful to develop a highly soluble resist, such as a resist for the ArF light source, in a short time period (e.g., 1-2 seconds) by applying a high-temperature developing solution to the resist.

Figure 9:
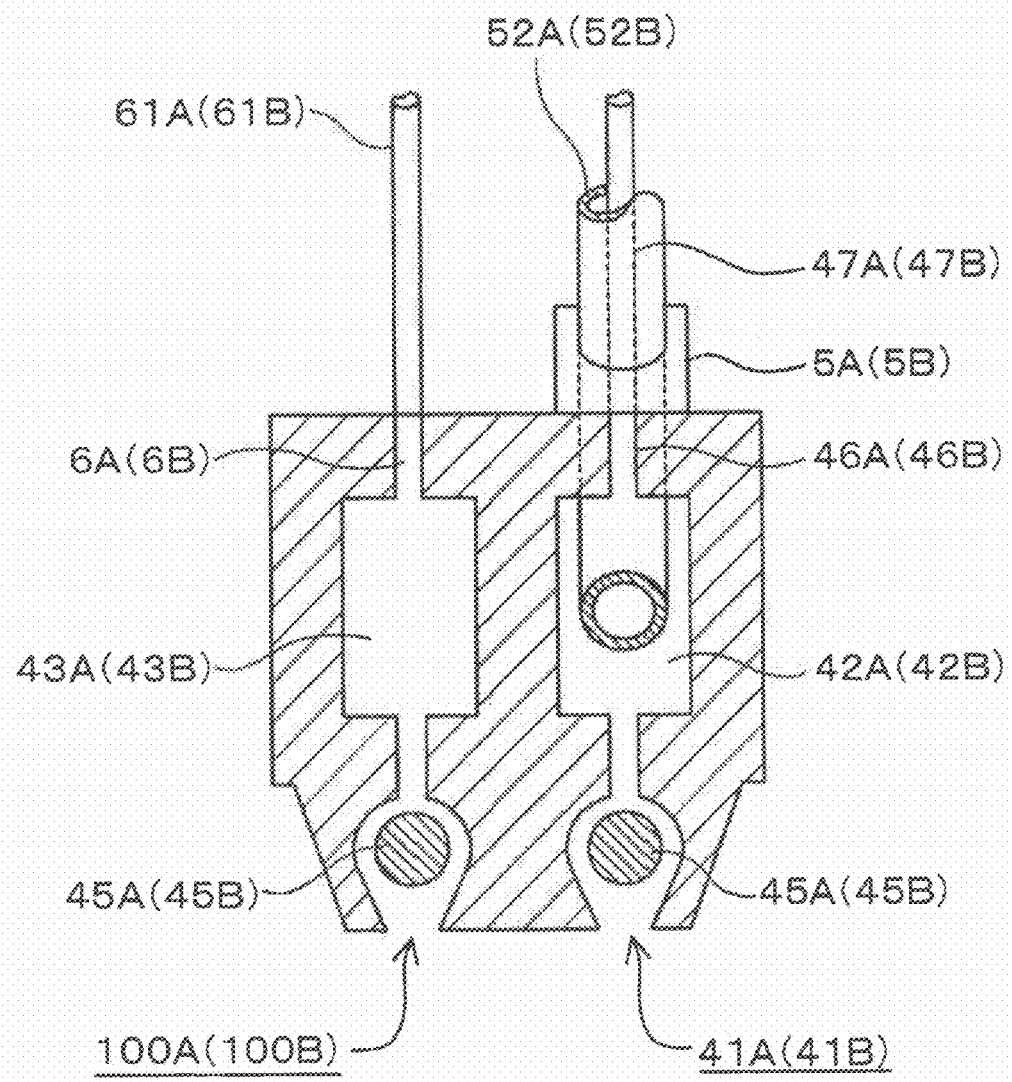
FIG. 9 is a diagram illustrating a developer nozzle of the developing apparatus in another embodiment.
Figure 10:
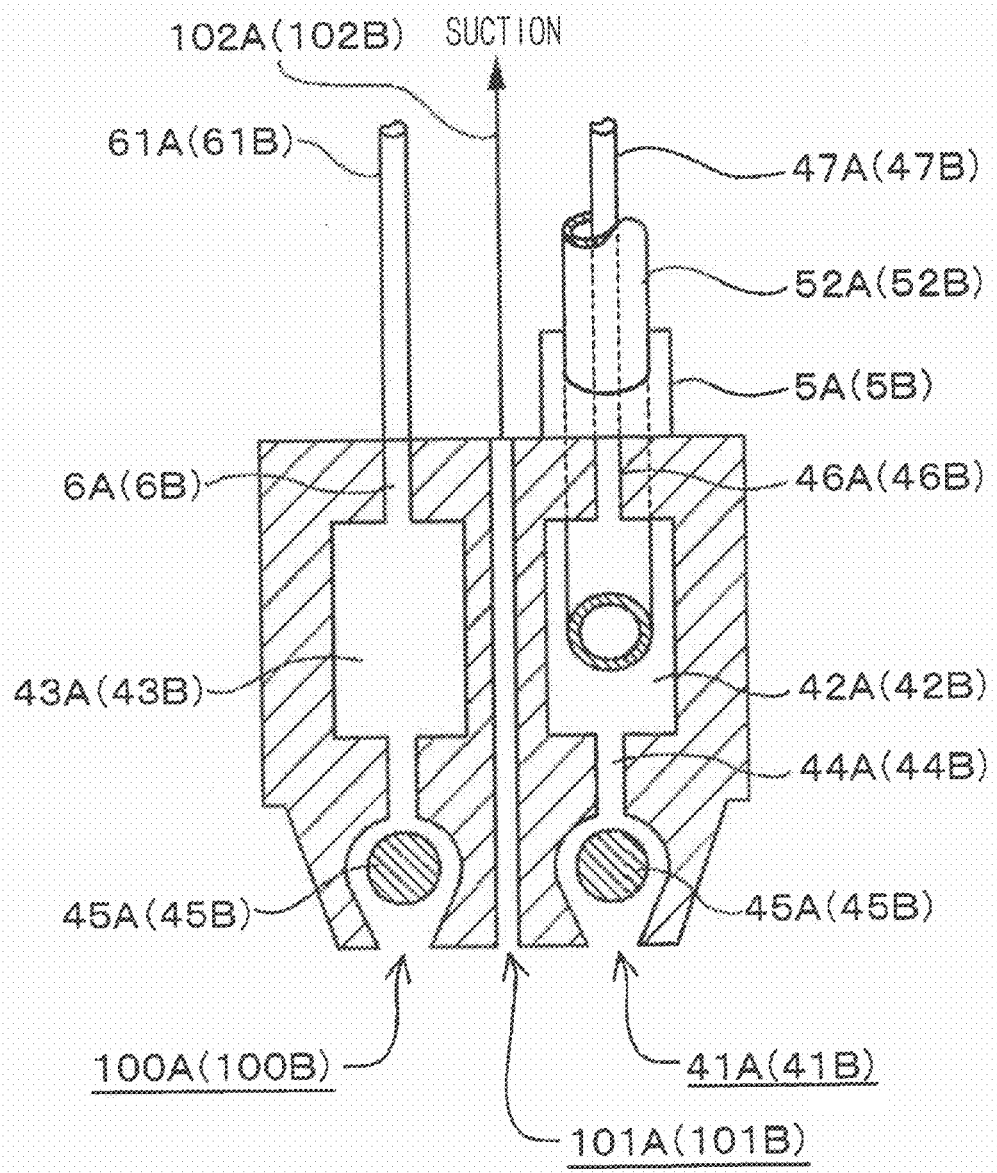
FIG. 10 is a diagram illustrating a developer nozzle of the developing apparatus in still another embodiment.

As shown in FIG. 10, the developer nozzle 4A shown in FIG. 9 may be modified by providing a suction port 101A for sucking a developing solution between the developer ejection port 41A and the diluent ejection port 100A. A suction means (not shown) may be connected to the suction port 101A through a suction passage 102A. A suction operation can prevent incompleteness of the pattern resulted from disturbed flow caused by collision between the developing solution and the diluent, and thus achieves a pattern with high line-width accuracy.

Figure 11:
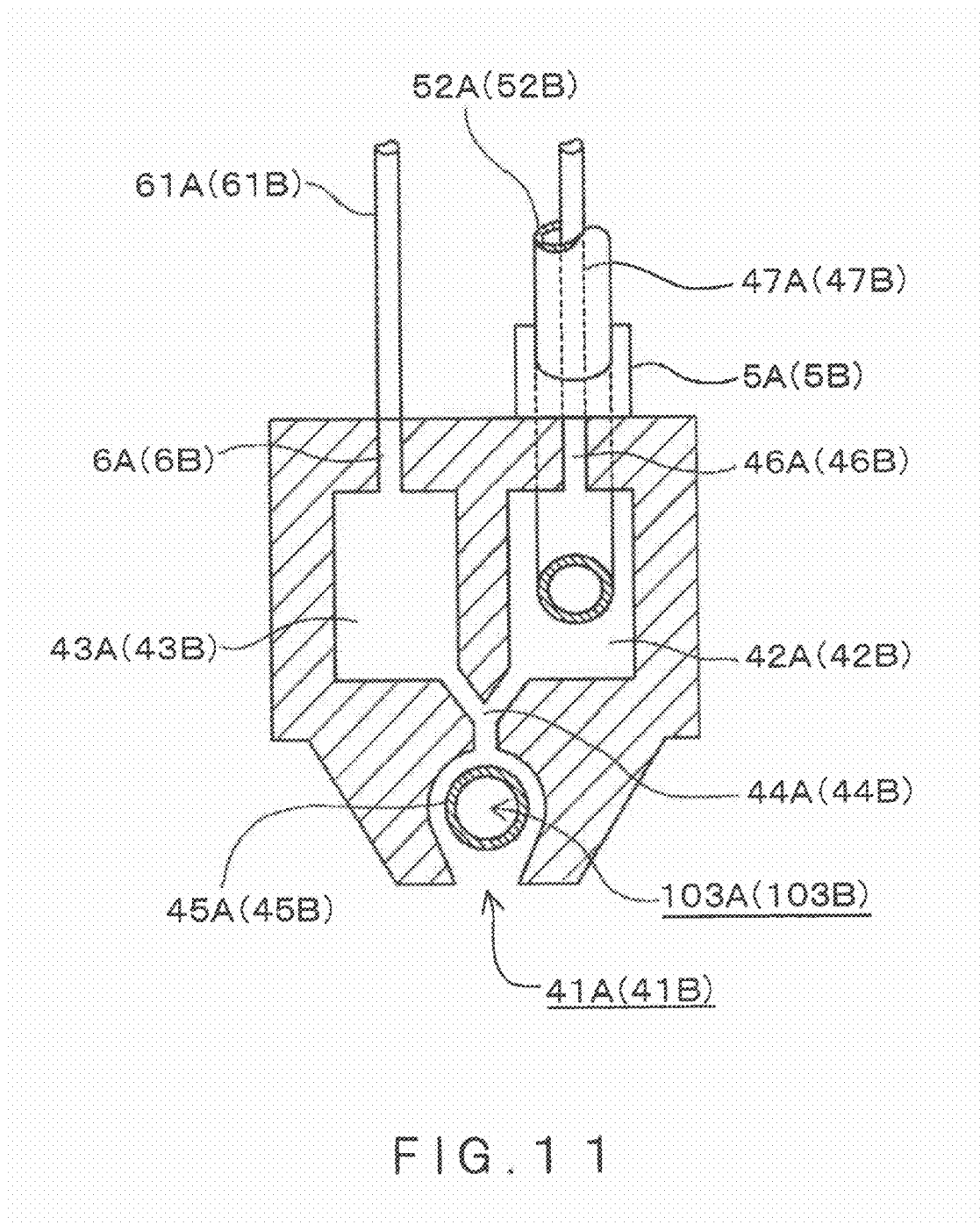
FIG. 11 is a diagram illustrating a developer nozzle of the developing apparatus in still another embodiment.

Still another embodiment of the developer nozzle 4A will be described with reference to FIG. 11. In this embodiment, a temperature-control water passage 103A (or 103B) is provided in a damper rod 45A (45B). The damper rod 45A (45B) functions as an auxiliary temperature regulating unit. Except for the above, the developer nozzle shown in FIG. 11 has substantially the same structure as that of the developer nozzle shown in FIG. 3. When the developing solution need be heated, the surface of the damper rod 45A (45B) is preferably set to a temperature slightly higher than a target temperature (for example, 1° C. higher than the target temperature); and when the developing solution need be cooled, the surface of the buffer 45A (45B) is preferably set to a temperature slightly lower than a target temperature (for example, 1° C. lower than the target temperature). In the developer nozzle shown in FIG. 11, the temperature of the developing solution is also adjusted in the ejection port 41A, allowing the temperature of the developing solution supplied to the wafer W to be adjusted more accurately. If only heating function is necessary, a heater may be buried in the damper rod 45A (45B). The damper rod 45A (45B) having a temperature control function can also be applied to the developer nozzles 4A of FIGS. 7 to 10. A heat pipe may be provided in the damper rod 45A (45B).

Figure 12:
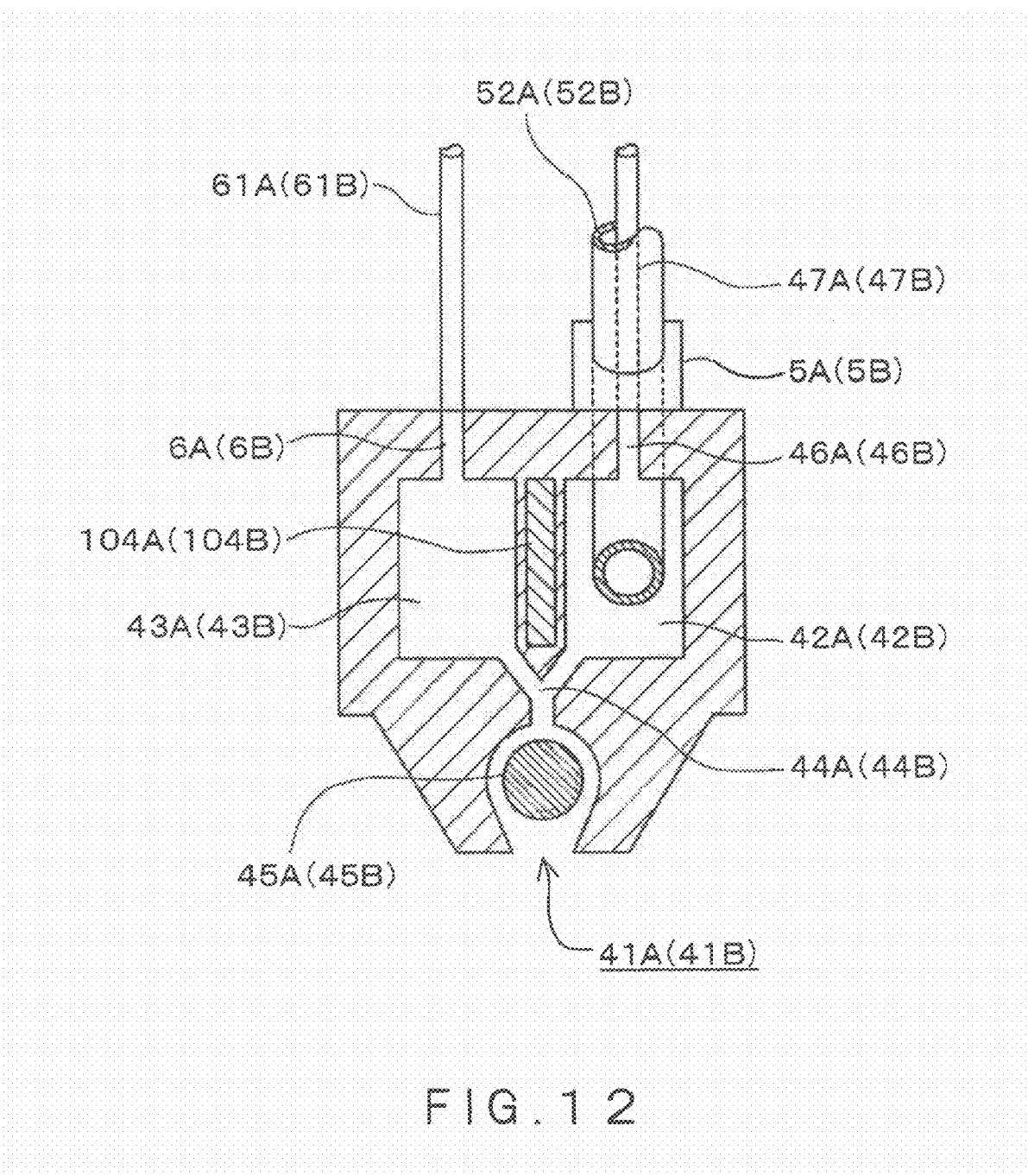
FIG. 12 is a diagram illustrating a developer nozzle of the developing apparatus in still another embodiment.

Still another embodiment of the developer nozzle will be described with reference to FIG. 12. The developer nozzle shown in FIG. 12 has therein a thermo-module 104A (104B), which comprises an element utilizing the Peltier effect, and which serves as a temperature regulating unit. The thermo-module 104A (104B) is connected to a power supply (not shown) by a wire (not shown). The thermo-module 104A (104B) is interposed between the developer buffer portion 42A and the diluent buffer portion 43A. The surface of the thermo-module that generates heat when energized faces the developer buffer portion 42A. The developer nozzle shown in FIG. 12 has substantially the same structure as that of the developer nozzle shown in FIG. 3, except for the above respects. Supplying a current (for example, a direct current) to the thermo-module 104A (104B) causes a surface of the thermo-module 104A (104B) to generate heat and thereby heat the developing solution in the developer buffer portion 42A (42B) to a predetermined temperature.

Another thermo-module (not shown) may be additionally provided in the developer nozzle such that the surface of the module that absorbs heat when energized faces the developer buffer portion 42A. In this case, when the developing solution need be cooled, a current is supplied to the not shown thermo-module; and when the developing solution need be heated, a current is supplied to the shown thermo-module 104A (104B).

The foregoing thermo module may be provided not only in the developer nozzle shown in FIG. 3 but also in the developer nozzles shown in FIGS. 8 to 10; and may be combined with the foregoing damper rod 45A (45B) having the temperature control function.

Although the present invention has been described in detail based on the illustrated embodiments with reference to drawings, the invention is not limited to the foregoing embodiments, and thus various modifications are possible, as illustrated below.

In the present invention, the diluent to be supplied to the surface of the wafer covered with developing solution is not limited to a diluted developing solution (i.e., a developing solution diluted with deionized water), and may be deionized water or a surfactant.

In the present invention, it is not always necessary to adjust the temperature of the developing solution to increase the dissolution rate. For example, if there is sufficient developing time before the timing of starting ejection of the diluent, one resist may be selected from various types of resists, and the developing time for the other resists may be conformed to the developing time for said one resist. Also in this case, essentially the same advantages as those described above can be achieved.

In the present invention, the number of times of the nozzle scanning operation, in which the developer nozzle 4A (4B) moves the from one end to the opposite end of the wafer W while ejecting a developing solution or a diluent, is not limited to one, and may be plural number (e.g., 2-4 or more). The number of times of the scanning operation may be determined based on the time required to develop the resist or on the state of diffusion of the dissolved resist components. For example, in a case where it takes one second for the developer nozzle 4A (4B) to move from one end to the opposite end of the wafer W, if the required developing time is five seconds, the scanning operation is performed five times.

The above developing apparatus may be used while maintaining the developing solution at a temperature of 23° C., which is equal to the temperature of the clean room in which the developing apparatus is installed. Also in this case, uniform and favorable development of the wafer can be achieved due to the accurate temperature control function of the temperature regulating units.

The present invention is not limited to an embodiment in which a single nozzle is used to eject both a developing solution and a diluent. A developer nozzle for ejecting a developing solution and a diluent nozzle for ejecting a diluted developing solution (or deionized water) may be arranged separately.

In the present invention, the diluent buffer portion 43A in the developer nozzle shown of FIG. 3 may be used as a developer buffer portion, so that a first developing solution and a second developing solution may be stored in the developer buffer portion 42A and the diluent buffer portion 43A, respectively, and so that two different developing solutions (e.g., developing solutions of different temperatures) may be supplied. In such a case, a nozzle for ejecting a diluted developing solution (or diluent) may be provided separately.

Figure 13:
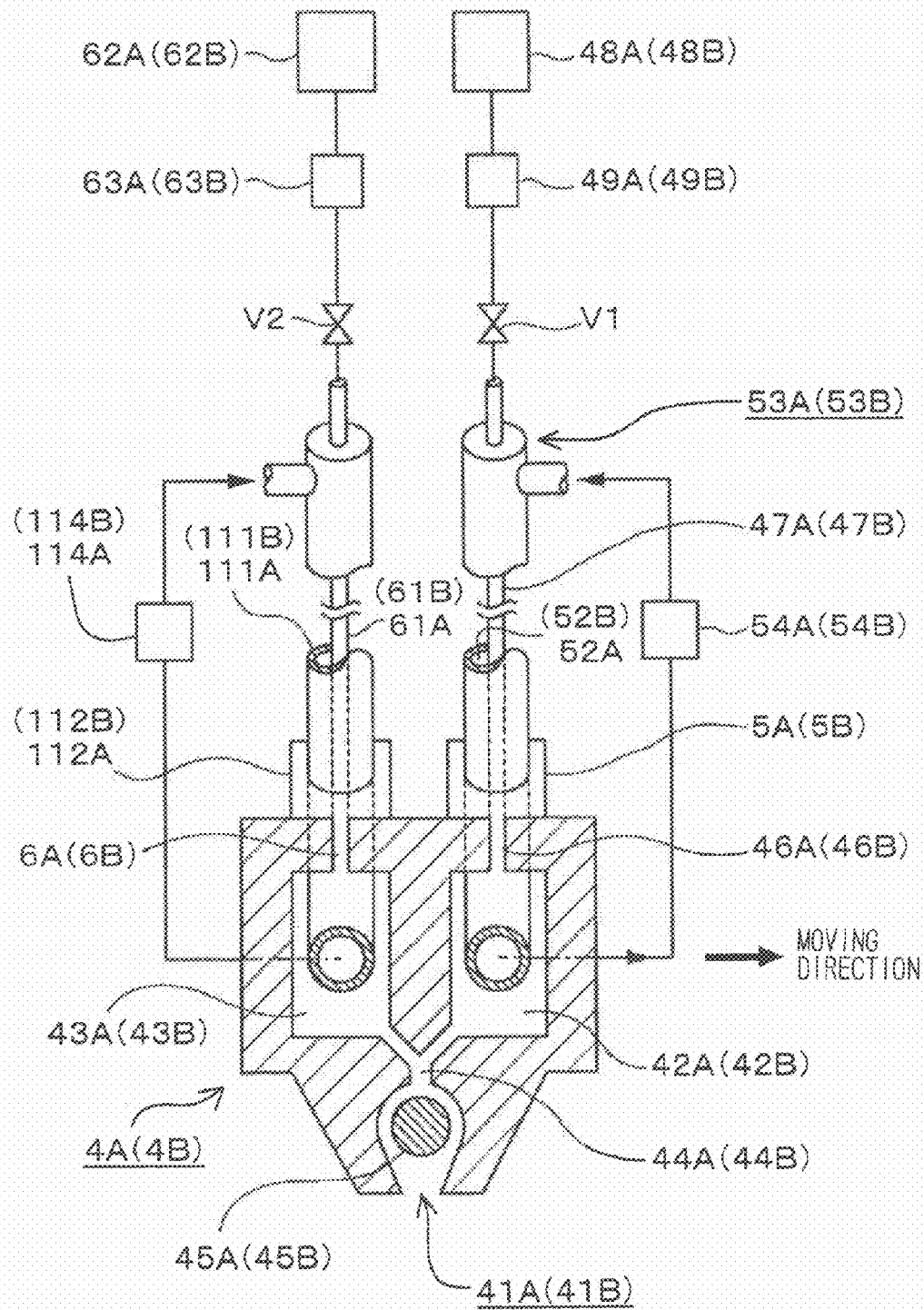
FIG. 13 is a diagram illustrating a developer nozzle of the developing apparatus in still another embodiment.

In the present invention, an auxiliary temperature regulating unit having the same configuration as that of the above auxiliary temperature regulating unit for controlling the temperature of the developing solution may be provided for the diluent buffer portion 43A side to control the temperature the diluted developing solution (or diluent), as shown in FIG. 13. Referring to FIG. 13, reference numeral 110A (110B) denotes a double tube structure composed of a diluent tube 61A (61B) and a temperature-control water tube 111A (111B) enclosing the diluent tube 61A (61B) with a gap being defined therebetween. The temperature control water tube 111A (111B) connects a temperature-control water buffer portion 112A (112B) and a not shown temperature-control water buffer portion 113A (113B) on the other end side of the nozzle, and arranged in the diluent buffer portion 43A (43B), to constitute an auxiliary temperature regulating unit together with the double tube structure 110A (110B). Reference numeral 114A (114B) denotes a temperature controller provided in the temperature-control water circulation passage to control the temperature of the temperature-control water. The other portions of this developer nozzle are substantially the same as those of developer nozzle shown in FIG. 3. In the developer nozzle shown in FIG. 13, as the temperature of the diluent is controlled at a position close to the ejection port 41A (41B), it is possible to accurately control the temperature of the diluent and to change the temperatures of the developing solution and the diluent over a wide range. The above auxiliary diluent temperature regulating unit can also be applied to, for example, the developer nozzles shown in FIGS. 8 and 12.

In the present invention, the concentration of the developing solution may be controlled, in addition to its temperature. The concentration of the developing solution can be changed by changing the flow rate ratio between the developing solution and the deionized water mixed with it by using a flow rate control unit (not shown). Alternatively, a plurality of developer supply sources 48A (48B) may be provided so as to be able to supply developing solutions of different concentrations. With this arrangement, one of these developer supply sources 48 may be selected according to the desired developing solution concentration by switching valves. The flow rate control unit and these valves constitute a portion of a developing solution concentration control unit.

In the present invention, the substrate is not limited to a wafer W, and may an LCD substrate or a reticle substrate for a photomask.

Figure 14:
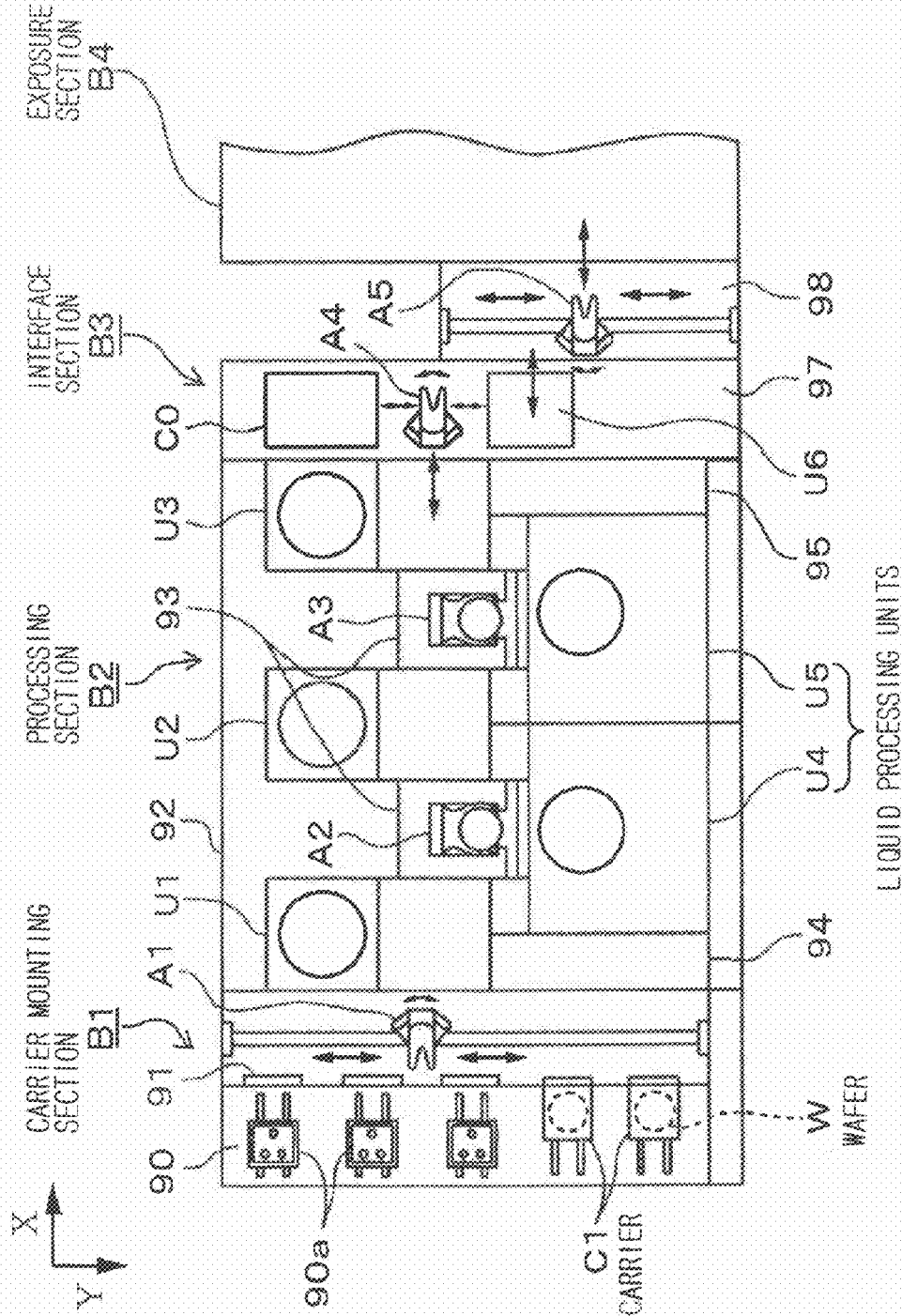
FIG. 14 is a plan view of an example of a coating-and-developing apparatus incorporating the developing apparatus.
Figure 15:
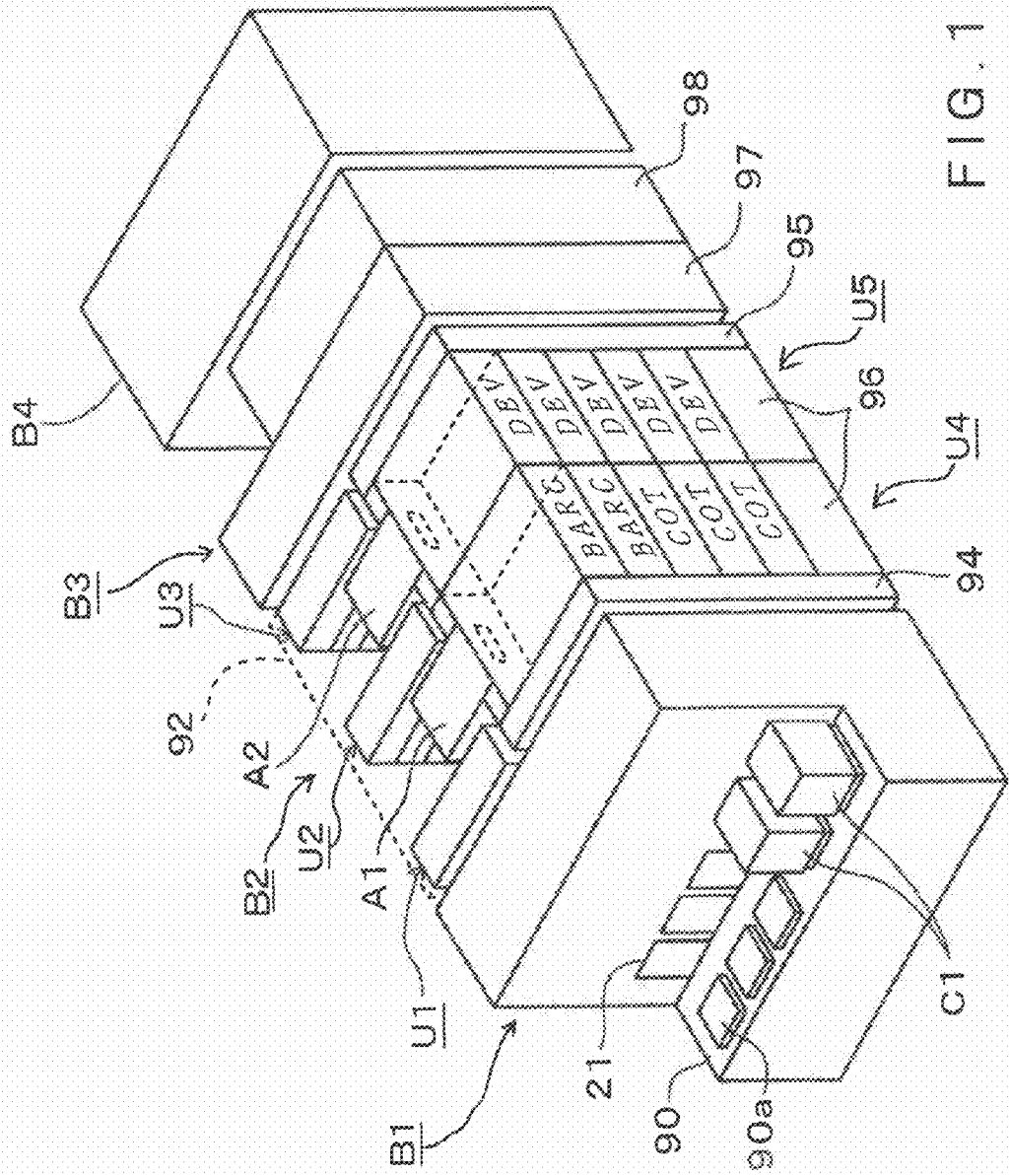
FIG. 15 is a perspective view of the coating-and-developing apparatus incorporating the developing apparatus.

There will now be described an exemplary configuration of a coating-and-developing apparatus incorporating the above developing apparatus with reference to FIGS. 14 and 15. In these figures, reference numeral B1 denotes a cassette mounting section for transferring cassettes C to and from the coating-and-developing apparatus, each cassette C being airtight and containing a plurality of wafers W (for example, 13 wafers W). The cassette mounting section B1 includes: a cassette station 90 having a mount stage 90a on which a plurality of cassettes C can be mounted; shutters 91 provided in the wall surface in front of the cassette station 90; and a transfer device A1 for removing wafers W from the cassettes C through the shutters 91.

A processing section B2 enclosed in an enclosure 92 is connected to the cassette mounting section B1. Unit towers U1, U2, and U3 are disposed within the processing section B2 such that the cassette mounting section B1 and the unit towers U1, U2, and U3 are adjacent each other in that order. Each unit tower is composed of pluralities of heating units and cooling units stacked on one another. Main transfer devices A2 and A3 are provided between adjacent unit towers to transfer wafers W between processing units including coating units and developing units. Each unit tower includes a transfer unit. The wafers W can be transferred from the unit tower U1 to the unit tower U3 within the processing section B1 through these transfer units. The main conveyer A2 and A3 are installed in the spaces defined by sides of unit towers (U1, U2, U3), sides of liquid processing unit towers (U4, U5), and partition walls 93. In the figures, reference numerals 94 and 95 denote temperature/humidity control units each including a temperature control device for controlling the temperature of processing liquids used in each unit, a temperature/humidity control duct, etc.

The liquid processing unit towers U4 and U5 each include a storage unit 96 for storing chemical solutions, such as coating liquids (resist liquids) and developing solutions, and a plurality of other units (for example, 5 other units) stacked on one another over the storage unit 96. These units include: coating units COT; developing apparatuses of the present invention, that is, developing units DEV; and/or antireflective film forming units BARC. The unit towers U1, U2, and U3 each include pluralities of various units (e.g., 10 units) stacked on one another for pre-processing and post-processing for the liquid processing performed by the liquid processing units U4 and U5. These various units include baking units, cooling units, etc.

An exposure section B4 is connected to the far side of the unit tower U3 of the processing section B2 through an interface section B3 that includes a first transfer chamber 97 and a second transfer chamber 98. The interface section B3 further includes: two transfer devices A4 and A5 for transferring wafers W between the processing section B2 and the exposure section B4; a unit tower U6; and a buffer cassette C0.

There will now be described the flow of steps for processing each wafer in this system. First, when a cassette C containing wafers W has been brought into the coating-and-developing apparatus and placed on the mount stage 90, the shutter 91 and the cover of the cassette C are opened and a wafer W is removed from the cassette C by the transfer device A1. Then, the wafer W is transferred to the main transfer device A2 through the transfer unit provided in the unit tower U1, and subjected to a pretreatment process for a coating process in one of the unit towers U1 to U3 (for example, subjected to an antireflective film forming process and a cooling process). After that, the wafer W is coated with a resist liquid in a coating unit COT. Then, after being heated in a baking unit provided in one of the unit towers U1 to U3, the wafer W is cooled and transferred to the interface section B3 through the transfer unit of the unit tower U3. The wafer W is then transferred to the exposure section B4 through the transfer device A4, the unit tower U6, and the transfer device AS in the interface section B3. Then, after being exposed in the exposure section B3, the wafer W is transferred back to the main transfer device A2 through the same passage in reverse and then developed in the developing unit DEV, thereby formation of a resist mask is completed. After that, the wafer W is returned to the original cassette C on the mounting stage 90.

The invention claimed is:

1. A developing method comprising the steps of:
    applying a developing solution having a first developer concentration from a nozzle to a surface of an exposed resist film provided on a substrate when the substrate is not rotating;
    before said step of applying a developing solution, adjusting the temperature of the developing solution to a predetermined temperature such that the resist in a region to be removed by a development reaction is at least partially dissolved by the developing solution;
    leaving the substrate coated with the developing solution to stand not rotating for a predetermined period of time to promote said development reaction, thereby dissolving the region of the resist to be removed by the development reaction;
    after the step of leaving the substrate coated with the developing solution, supplying a diluent having a second developer concentration lower than the first developer concentration to the substrate for reducing a concentration of the developing solution thereby suppressing or stopping dissolving of the resist; and
    after the step of supplying the diluent, supplying a cleaning liquid to the substrate for cleaning;
    wherein the supplying a diluent is performed when the developing solution on the substrate is deteriorated due to progression of said developing reaction after supplying of the developing solution.

2. The developing method according to claim 1, wherein each of the step of applying the developing solution and the step of supplying the diluent includes a step of moving a nozzle from one end of the substrate to the opposite end the substrate, the nozzle having therein an ejection port that has a length substantially equal to or larger than a width of an effective area of the substrate.

3. The developing method according to claim 2, wherein a nozzle movement direction and a nozzle movement speed at the step of supplying the diluent are the same as those at the step of applying the developing solution.

4. The developing method according to claim 1, wherein the step of applying the developing solution and the step of supplying the diluent use the same nozzle to deliver the developing solution and the diluent, respectively, to the surface of the substrate.

5. The developing method according to claim 1, wherein:
    the developing method is performed by using a developing apparatus including a plurality of developer nozzles; and
    said developing method further comprising the step of:
    while a developing solution is being applied by using one of the plurality of developer nozzles, adjusting the temperature of a developing solution for another one of the plurality of developer nozzles.

6. The developing method according to claim 5, wherein the plurality of developer nozzles are integrated together into a single liquid-supplying nozzle unit.

7. The developing method according to claim 1, further comprising the step of:
    adjusting temperature and concentration of a developing solution before the developing solution is applied to the substrate.

8. The developing method according to claim 7, wherein:
    the developing method is performed by using a developing apparatus including a plurality of developer nozzles; and
    said developing method further comprising the step of:
    while a developing solution is being applied by using one of the plurality of developer nozzles, adjusting temperature and concentration of a developing solution for another one of the plurality developer nozzles.

9. The developing method according to claim 1, wherein, at any portion of an effective area of the substrate, a diluent is supplied 20 seconds or less after a developing solution is supplied.

10. The developing method according to claim 1, wherein the diluent supply step is performed such that, at any portion of an effective area of the substrate, the supplying of the diluent is initiated diluent is supplied 20 seconds or less after a developing solution is supplied to the non-rotating wafer.

11. The developing method according to claim 1, wherein said supply a cleaning liquid comprises supplying a rinse liquid while the substrate is rotated.

12. The developing method of claim 1, wherein the nozzle includes a developer buffer chamber for storing developing solution, an ejection port provided below the developer buffer chamber for ejecting developing solution stored in the developer buffer chamber, and a damper rod provided within the ejection port,
    wherein the step of applying of the developing solution is performed using the developer supply nozzle, while the developing solution supplied from the developer buffer chamber into the ejection port collides with damper rod to reduce an impact of the ejected solution on the surface of the wafer, and
    wherein the adjusting the temperature of the developing solution is performed using a first temperature regulating device provided in the buffer chamber and a second temperature regulating device provided in the damper rod.

* * * * *